(12) United States Patent
Kim et al.

(10) Patent No.: US 10,515,982 B2
(45) Date of Patent: Dec. 24, 2019

(54) SEMICONDUCTOR DEVICE

(71) Applicant: KOREA UNIVERSITY RESEARCH AND BUSINESS FOUNDATION, Seoul (KR)

(72) Inventors: Sangsig Kim, Seoul (KR); Kyoungah Cho, Seoul (KR); Minsuk Kim, Gyeonggi-do (KR); Yoonjoong Kim, Seoul (KR); Sola Woo, Gyeonggi-do (KR); Doohyeok Lim, Seoul (KR)

(73) Assignee: Korea University Research and Business Foundation, Seoul (KR)

( * ) Notice: Subject to any disclaimer, the term of this patent is extended or adjusted under 35 U.S.C. 154(b) by 0 days.

(21) Appl. No.: 15/869,917

(22) Filed: Jan. 12, 2018

(65) Prior Publication Data

US 2018/0138199 A1    May 17, 2018

Related U.S. Application Data

(63) Continuation of application No. PCT/KR2017/010325, filed on Sep. 20, 2017.

(30) Foreign Application Priority Data

Sep. 26, 2016  (KR) .......................... 10-2016-0123410

(51) Int. Cl.
*H01L 27/118*  (2006.01)
*G06N 3/02*  (2006.01)
*H01L 29/66*  (2006.01)
*G06N 3/063*  (2006.01)
*H01L 27/105*  (2006.01)
*H01L 27/108*  (2006.01)
(Continued)

(52) U.S. Cl.
CPC .......... *H01L 27/11807* (2013.01); *G06N 3/02* (2013.01); *G06N 3/063* (2013.01);
(Continued)

(58) Field of Classification Search
None
See application file for complete search history.

(56) References Cited

U.S. PATENT DOCUMENTS 8,754,470 B1 *  6/2014  Chuang ............. H01L 29/66356
                                                                                  257/135
9,343,462 B2     5/2016  Tang
                      (Continued)

FOREIGN PATENT DOCUMENTS

KR     10-2012-0123584 A    11/2012
KR       1020130092930 A     8/2013

OTHER PUBLICATIONS

Korean Office Action for Application No. 10-2016-0123410 dated Aug. 2, 2017.
(Continued)

*Primary Examiner* — Cuong B Nguyen
(74) *Attorney, Agent, or Firm* — Jenkins, Wilson, Taylor & Hunt, P.A.

(57) ABSTRACT

A semiconductor device includes a semiconductor column including a first conductive region of first conductivity type, a second conductive region of second conductivity type, an intrinsic region disposed between the first conductive region and the second conductive region, and a barrier region of the first conductivity type disposed between the intrinsic region and the second conductive region. A gate electrode is disposed to cover the intrinsic region, and a gate insulating layer is disposed between the gate electrode and the intrinsic region. The semiconductor device may operate as a switch or a volatile memory according to a gate voltage applied to a gate and a drain voltage applied to a drain.

12 Claims, 22 Drawing Sheets

(51) Int. Cl.
  H01L 27/11  (2006.01)
  G11C 11/39  (2006.01)
  G11C 11/54  (2006.01)

(52) U.S. Cl.
  CPC .............. G11C 11/39 (2013.01); G11C 11/54 (2013.01); H01L 27/1052 (2013.01); H01L 27/10802 (2013.01); H01L 27/1104 (2013.01); H01L 29/66 (2013.01); *H01L 2027/11838* (2013.01); *H01L 2027/11875* (2013.01)

(56) References Cited

U.S. PATENT DOCUMENTS

| 9,356,236 | B2 | 5/2016 | Park et al. |
| 2005/0001232 | A1 | 1/2005 | Bhattacharyya |
| 2005/0247962 | A1 | 11/2005 | Bhattacharyya |
| 2013/0314986 | A1 | 11/2013 | Nemati et al. |
| 2016/0064535 | A1* | 3/2016 | Verhulst .............. H01L 29/7391 257/12 |
| 2016/0268256 | A1* | 9/2016 | Yang .................... H01L 27/088 |

OTHER PUBLICATIONS

International Search Report for Application No. PCT/KR2017/010325 dated Jan. 11, 2018.
Korean Grant of Patent for Application No. 10-2016-0123410 dated Feb. 23, 2018.
English Translation of the International Preliminary Report on Patentability and Written Opinion for Application No. PCT/KR2017/010325 dated Mar. 26, 2019.

* cited by examiner n-channel

SEMICONDUCTOR DEVICE

CROSS-REFERENCE TO RELATED APPLICATIONS

This application is a continuation of and claims priority to PCT/KR2017/010325 filed on Sep. 20, 2017, which claims priority to Korea Patent Application No. 10-2016-0123410 filed on Sep. 26, 2016, the entireties of which are both incorporated by reference herein.

TECHNICAL FIELD

The present disclosure relates to a silicon semiconductor device that is capable of performing a switching operation or a nonvolatile memory operation and, more particularly, to a semiconductor device that operates with the positive feedback loop mechanism of a p-n-i-n nanostructure device and is capable of performing a switching operation and a memory operation.

BACKGROUND

Neuromorphic technology is to mimic a human neural structure with hardware based on CMOS integrated circuit technology. Conventional computers based on von Neumann architecture are facing a great limitation in speed and power consumption when performing high-level cognitive application and treatment. Thus, current neuromorphic technology needs to be further studied.

Neuromorphic technology has allowed high capacity, high density, low power consumption, and improved speed of chips to be achieved with package on package (PoP) and through silicon via (TSV) that are packaging technologies. However, since a memory and a processor of a computer based on von Neumann architecture are basically separated from each other, a bus connecting the memory and the processor to each other does not support capacity. This phenomenon is called "von Neumann bottleneck".

A synapse device is most important in implementing a neuromorphic system because it is a foundation for the neuromorphic system. A synapse device should have a switching function as well as a memory involving a memory for stimulation which is similar to a function of a brain synapse.

Memristor synapse devices are being studied all over the world. In order to apply to a synapse-mimicking device, a memristor synapse device has a switching function as well as a memory having various materials and structures such as resistive random access memory (ReRAM), phase change access memory (PCRAM) or ferroelectric random access memory (FeRAM). However, since a memristor synapse device cannot be used in a conventional silicon CMOS process, there is difficulty in commercializing the memristor synapse device. Additionally, a static random access memory (SRAM) that can be used in the conventional silicon CMOS process requires at least six transistors (6T) and suffers from disadvantages such as higher power consumption and much larger area than other synapse-mimicking devices. Since having only a memory function, the SRAM also requires a switching function. Accordingly, there is a need to develop a new conceptual synapse-mimicking device, which operates as an SRAM with one transistor (1T) including a silicon channel based on a conventional CMOS process and may achieve miniaturization and integration, reduce leakage current to have features of low power and high efficiency, and secure a sufficient read sensing margin, in which a memory function and a switching function converge.

In the case of a conventional thyristor dynamic random access memory (DRAM), read/write/erase operations are determined according to a voltage applied to a drain while a voltage applied to a gate is fixed. That is, the thyristor DRAM is designed in such a way that hysteresis characteristics on an $I_{DS}$-$V_{DS}$ characteristic curve are used as a memory. When read/write operations are performed, all voltages to be applied to a drain should be positive voltages. When an erase operation is performed, a negative voltage is applied to a drain because charges accumulated in a channel body should be removed.

Up to the present time, there is never any technology to use, as a memory, hysteresis characteristics on $I_{DS}$-$I_{GS}$ characteristic curve where read/write/erase operations are determined according to a voltage applied to a gate while a voltage applied to a drain is fixed.

A thyristor-based memory is disclosed in Korean Patent Registration No. 10-1480211.

SUMMARY

Example embodiments provide a synapse-mimicking device that may use a conventional CMOS process.

Example embodiments provide a 1T-memory that has a larger device area and lower power consumption than a conventional 6T-SRAM.

Example embodiments provide de a 1T-memory that may perform not only a memory function but also a switching function.

Example embodiments provide functional convergence of a memory and a switching device, not structural coupling thereof.

Example embodiments provide a 1T-memory a 1T-memory with improved processing speed as compared to a conventional memory device.

Example embodiments provide a semiconductor memory device that makes miniaturization and integration of a memory device possible with a simple structure, reduces leakage current to have features of low power and high efficiency, and includes a vertical semiconductor column of a new structure to secure sufficient current sensing margin or sufficient read sensing margin even in a narrow memory window and a selective volatile mode operation semiconductor memory device using the semiconductor memory device.

More specifically, example embodiments provide a semiconductor memory device that requires a low applied voltage during write/erase operations, has a higher on-off current ratio and a low subthreshold swing (SS) characteristic to secure a sufficient current sensing margin even in a narrow memory window, has operating voltage characteristics required per low unit cell structure, and includes a novel nanostructure allowing volatile/switching operation characteristic to be implemented in a single device and a selective volatile mode operation semiconductor memory device using the semiconductor memory device.

Semiconductor device example embodiments include: a semiconductor column including a first conductive region of first conductivity type, a second conductive region of second conductivity type, an intrinsic region disposed between the first conductive region and the second conductive region, and a barrier region of the first conductivity type disposed between the intrinsic region and the second conductive region; a gate electrode disposed to cover the intrinsic region; and a gate insulating layer disposed between the gate electrode and the intrinsic region. The semiconductor device may operate as a switch or a volatile memory according to a gate voltage applied to a gate and a drain voltage applied to a drain.

In example embodiments, the semiconductor column may extend vertically on a substrate, the first conductivity type of the first conductive region may be n-type, and the first conductive region may provide a source and the second conductive region may provide a drain.

In example embodiments, the semiconductor column may extend vertically on a substrate, the first conductivity type of the first conductive region may be p-type, and the first conductive region may provide a drain and the second conductive region may provide a source.

In example embodiments, when the semiconductor device operates the nonvolatile memory, to write a first logic state, a first gate voltage is applied to the gate electrode and a first drain voltage is applied to the second conductive region; to hold the first logic state, a second gate voltage is applied to the gate electrode and a second drain voltage is applied to the second conductive region; to read the first logic state, the second gate voltage is applied to the gate electrode and the first drain voltage is applied to the second conductive region; to write a second logic state, a third gate voltage is applied to the gate electrode and the first drain voltage is applied to the second conductive region; to hold the second logic state, a second gate voltage is applied to the gate electrode and the second drain voltage is applied to the second conductive region; and to read the second logic state, the second gate voltage is applied to the gate electrode and the first drain voltage is applied to the first conductive region.

In example embodiments, the first conductive type may be n-type, the second conductive type may be p-type, the first gate voltage may be between −0.25V and −1V, the second gate voltage may be between −0.1V and 0.1V, the third gate voltage may be between 0.25V and 1V, the first drain voltage may be between 0.5V and 1.5V, and the second drain voltage may be 0V.

In example embodiments, when the semiconductor device operates as the switch, to switch to a first state, a positive first gate pulse is applied to the gate electrode while a first drain voltage is applied to the second conductive region; and to switch to a second state from the first state, a negative second gate pulse is applied to the gate electrode while the first drain voltage is applied to the second conductive region.

In example embodiments, the first conductivity type may be n-type, the second conductivity type may be p-type, the first gate pulse may be a negative voltage, the second gate pulse may be a positive voltage, and the drain voltage may be between 0.5V and 1.5V.

In example embodiments, the substrate may include an active region and a device isolation layer, the first conductive region may be disposed in contact with the active region, and the active region may be doped with impurities of the first conductive type.

In example embodiments, the semiconductor device may further include: a source line disposed on the substrate. The first conductive region may be disposed in contact with the source line, and the source line may include silicon doped with impurities of the first conductivity type.

In example embodiments, the first conductive region, the intrinsic region, the barrier region, and the second conductive region may be sequentially disposed along the semiconductor column as proceeding from a bottom surface to a top surface.

In example embodiments, the second conductive region, the barrier region, the intrinsic region, and the first conductive region may be sequentially disposed along the semiconductor column as processing from a bottom surface to a top surface.

In example embodiments, the semiconductor device may further include: a ring-shaped residual oxide layer disposed to cover the semiconductor column on a bottom surface of the semiconductor column.

A volatile memory device according to example embodiment includes: a substrate having a placement plane defined by a first direction and a second direction perpendicular to the first direction; source lines extending on the substrate in the second direction parallel to each other; semiconductor columns periodically disposed on the source line and extending perpendicular to the placement plane of the substrate; wordlines disposed to cover side surface of the semiconductor columns arranged in the first direction and extending in the first direction; a gate insulating layer disposed between the semiconductor column and the wordline to cover a side surface of the semiconductor column; gate isolation layers extending in the first direction and filling spaces between the wordlines; and bitlines extending in the second direction while being in contact with top surfaces of the semiconductor columns arranged in the second direction. The semiconductor column may include a first conductive region of first conductivity type, a second conductive region of second conductivity type, an intrinsic region disposed between the first conductive region and the second conductive region, and a barrier region of the first conductivity type disposed between the intrinsic region and the second conductivity type. The first conductive region may be in contact with the source line, and the second conductive region may be in contact with the bitline.

In example embodiments, to write a first logic state, a first gate voltage is applied to a selected wordline and a first drain voltage is applied to a selected bitline; to hold the first logic state, a second gate voltage is applied to a selected wordline and a second drain voltage is applied to a selected bitline; to read the first logic state, the second gate voltage is applied to a selected wordline and the first drain voltage is applied to a selected bitline; to write a second logic state, a third gate voltage is applied to a selected wordline and the first drain voltage is applied to a selected bitline; to hold the second logic state, a second gate voltage is applied to a selected wordline and the second drain voltage is applied to a selected bitline; and to read the second logic state, the second gate voltage is applied to a selected wordline and the first drain voltage is applied to a selected bitline.

A volatile memory device according to example embodiment incudes: a substrate having a placement plane defined by a first direction and a second direction perpendicular to the first direction; bitlines extending on the substrate in the second direction parallel to each other; semiconductor columns periodically disposed on the bitlines and extending perpendicular to the placement plane of the substrate; wordlines disposed to cover side surfaces of the semiconductor columns arranged in the first direction and extending in the first direction; a gate insulating layer disposed between the semiconductor column and the wordline to cover a side surface of the semiconductor column; gate isolation layers extending in the first direction and filling spaces between the wordlines; and source lines extending in the second direction while being in contact with top surfaces of the semiconductor columns arranged in the second direction. The semiconductor column may include a first conductive region of first conductivity type, a second conductive region of second conductivity type, an intrinsic region disposed between the first conductive region and the second conductive region, and a barrier region of the first conductivity type disposed between the intrinsic region and the second conductive region. The second conductive region may be in contact with the source line, and the second conductive region may be in contact with the bitline.

In example embodiments, to write a first logic state, a first gate voltage is applied to a selected wordline and a first drain voltage is applied to a selected bitline; to hold the first logic state, a second gate voltage is applied to a selected wordline and a second drain voltage is applied to a selected bitline; to read the first logic state, a second gate voltage is applied to a selected wordline and the first drain voltage is applied to a selected bitline; to write a second logic state, a third gate voltage is applied to a selected wordline and the first drain voltage is applied to a selected bitline; to hold the second logic state, a second gate voltage is applied to a selected wordline and the second drain voltage is applied to a selected bitline; and to read the second logic state, the second gate voltage is applied to a selected wordline and the first drain voltage is applied to a selected bitline.

A method for fabricating a semiconductor device according to example embodiments includes: forming a device isolation layer extending in a second direction on a substrate having a placement plane defined by a first direction and the second direction perpendicular to the first direction to define an active region; stacking a first interlayer dielectric, a doped silicon layer, and a second interlayer dielectric on the substrate where the active region is formed and forming a through-hole through the second interlayer dielectric, the doped silicon layer, and the first interlayer dielectric; forming a gate insulating layer on an exposed surface of the doped silicon layer within the through-hole; forming a semiconductor column within the through-hole, the semiconductor column including a first conductive region of first conductivity type, a second conductive region of second conductivity type, an intrinsic region disposed between the first conductive region and the second conductive region, and a barrier region of the first conductivity type disposed between the intrinsic region and the second conductive region; forming a trench penetrating the second interlayer dielectric and the doped silicon layer with the semiconductor columns, which are arranged in the first direction, interposed therebetween and extending in the first direction; filling the trench with a wordline isolation layer; and forming a bitline being in contact with the second conductive region of the semiconductor column and extending in the second direction.

In example embodiments, the method may further include: forming a sacrificial insulating layer to cover a sidewall of the through-hole and anisotropically etching the sacrificial insulating layer to form a sacrificial sidewall and to remove an auxiliary insulating layer formed on the active region when the gate insulating layer is formed; and selectively removing the sacrificial sidewall.

A method for fabricating a semiconductor device according to example embodiments includes: forming a first conductive line extending in a second direction on a substrate having a placement plane defined by a first direction and the second direction perpendicular to the first direction to define an active region; stacking a first interlayer dielectric, a doped silicon layer, and a second interlayer dielectric on the substrate where the first conductive line is formed and forming a through-hole through the second interlayer dielectric, the doped silicon layer, and the first interlayer dielectric; forming a gate insulating layer on an exposed surface of the doped silicon layer within the through-hole; forming a semiconductor column within the through-hole, the semiconductor column including a first conductive region of first conductivity type, a second conductive region of second conductivity type, an intrinsic region disposed between the first conductive region and the second conductive region, and a barrier region of the first conductivity type disposed between the intrinsic region and the second conductive region; forming a trench penetrating the second interlayer dielectric and the doped silicon layer with the semiconductor columns, which are arranged in the first direction, interposed therebetween and extending in the first direction; filling the trench with a wordline isolation layer; and forming a second conductive line being in contact with the second conductive region of the semiconductor column and extending in the second direction.

In example embodiments, the method may further include: forming a sacrificial insulating layer to cover a sidewall of the through-hole and anisotropically etching the sacrificial insulating layer to form a sacrificial sidewall and to remove an auxiliary insulating layer formed on the active region when the gate insulating layer is formed; and selectively removing the sacrificial sidewall.

BRIEF DESCRIPTION OF THE DRAWINGS

The present disclosure will become more apparent in view of the attached, example drawings and accompanying detailed description. The embodiments depicted therein are provided by way of example, not by way of limitation, wherein like reference numerals refer to the same or similar elements. The drawings are not necessarily to scale, emphasis instead being placed upon illustrating aspects of the present disclosure.

DETAILED DESCRIPTION

Figure 1A:
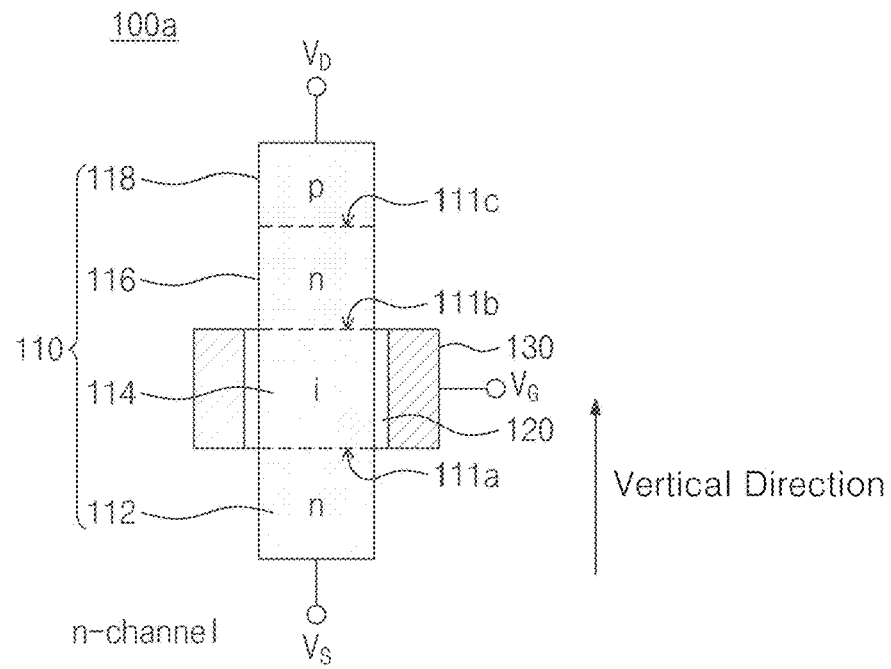
FIG. 1A is a structural drawing illustrating a basic structure of an n-channel semiconductor device according to an example embodiment of the present disclosure.

According to an example embodiment of the present disclosure, a semiconductor device having switching and memory functions is proposed. The semiconductor device adapts positive feedback loop mechanism and, unlike a conventional 6T-SRAM device, may implement a volatile memory with one transistor (or component) by applying electrical characteristics exhibited as an internal potential barrier is formed.

According to an example embodiment of the present disclosure, the semiconductor device may function as not only a memory but also a switching device if using the feature that memory characteristics are maintained even when a gate voltage is not applied after write and erase operations are performed because a read voltage is zero volt (0V).

A conventional 6T-SRAM is a volatile memory which is capable of storing data even when a separate voltage is not applied, as long as two inverters are complementarily coupled to maintain an operating power supply. A wordline functions as a switch to select an SRAM cell and activate the selected cell. A bitline writes data into a cell or performs a read operation when a wordline is connected to the bitline. A sense amplifier senses and amplifies a small difference in voltage between a bitline and a bitline bar $\overline{\text{bitline}}$.

A switchable semiconductor device is a new conceptual memory device using a feedback loop in a $p^+\text{-}n^+\text{-}i\text{-}n^+$ diode. A gate voltage applied to a gate electrode disposed over an intrinsic region with a gate insulating layer interposed therebetween to cover the intrinsic region operates a positive feedback loop using a potential barrier in a $p^+\text{-}n^+\text{-}i\text{-}n^+$ channel. The switchable memory device implements a switchable 1T-memory using a positive feedback loop principle based on a p-n-i-n nanostructure, which is a departure from the MOSFET operating principle of a conventional 6T-SRAM.

A switchable 1T-memory device may significantly decrease the number of transistors required for a conventional 6T-SRAM. Moreover, the switchable 1T-memory device may not require a sense amplifier. For these reasons, the switchable 1T-memory device may achieve simplified process, improved integration, and reduced power consumption. In the case of the conventional 6T-SRAM, a voltage should be applied to an operating power supply, a bitline, and a wordline to perform read/write operations. In the case of the 1T-memory device, read voltage characteristics make a memory operation possible even when a wordline voltage is not applied after write/erase operations. Thus, power consumption of the 1T-memory device may be reduced. In addition, a switching operation using characteristics of a read voltage of 0V is made possible. Thus, the 1T-memory device may be used as a synapse device in which memory and switching function converge.

In the $I_{DS}$-$V_{GS}$ transfer curve, when an energy barrier is adjusted by changing a gate voltage after a constant voltage of 1V at source and drain is applied, abrupt current flow occurs. This phenomenon is called "latch-up/down". At this point, a hysteresis curve formed during a cycle between −0.5V and 0.5V on the basis of 0V may be checked.

A feedback silicon channel one-transistor static random access memory (1T-SRAM) according to an example embodiment of the present disclosure, as a core element capable of highly integrating a neuromorphic system that is similar to a human brain, may perform large-scale parallel processing while consuming low-level energy.

Due to development of TrueNorth that is a neuromorphic chip, IBM is holding the lead in the field of chips for artificial intelligence (AI) until now. However, even in the TrueNorth, logic and memory functions are not realized in a single element. Moreover, since a conventional SRAM applied to the TrueNorth requires at least six transistors (6T), there is a limitation in high integration.

According to an example embodiment of the present disclosure, a device functioning as an SRAM using a feedback phenomenon of one transistor including a silicon channel is proposed as a post-TrueNorth neuromorphic device.

As a synapse-mimicking device, an SRAM has superior performance but suffers from disadvantages such as higher power consumption and much larger required area than other synapse-mimicking devices. A feedback silicon channel 1T-memory device proposed in the present disclosure is a new conceptual synapse-mimicking device that may overcome conventional disadvantages of an SRAM.

The IBM's TrueNorth has an integrated architecture in which a processor (neuron) and a memory (synapse) are disposed together, but the term "integrated" does not mean functional convergence that functions of a neuron and a synapse can be performed at the same time. According to an example embodiment of the present disclosure, a feedback silicon channel 1T-memory device may achieve functional convergence of components, not structural integration thereof.

A semiconductor device according to an example embodiment of the present disclosure is a chip including components that may be combined with each other to perform a logic operation function while having a memory function and may maximize integration and efficiency of power consumption.

Example embodiments will now be described more fully with reference to the accompanying drawings, in which some example embodiments are shown. Example embodiments may, however, be embodied in many different forms and should not be construed as being limited to the embodiments set forth herein; rather, these example embodiments are provided so that this disclosure will be thorough and complete, and will fully convey the scope of example embodiments of the present disclosure to those of ordinary skill in the art. In the drawings, the thicknesses of layers and regions are exaggerated for clarity. Like reference characters and/or numerals in the drawings denote like elements, and thus their description may be omitted.

FIG. 1A is a structural drawing illustrating a basic structure of an n-channel semiconductor device according to an example embodiment of the present disclosure.

Figure 1B:
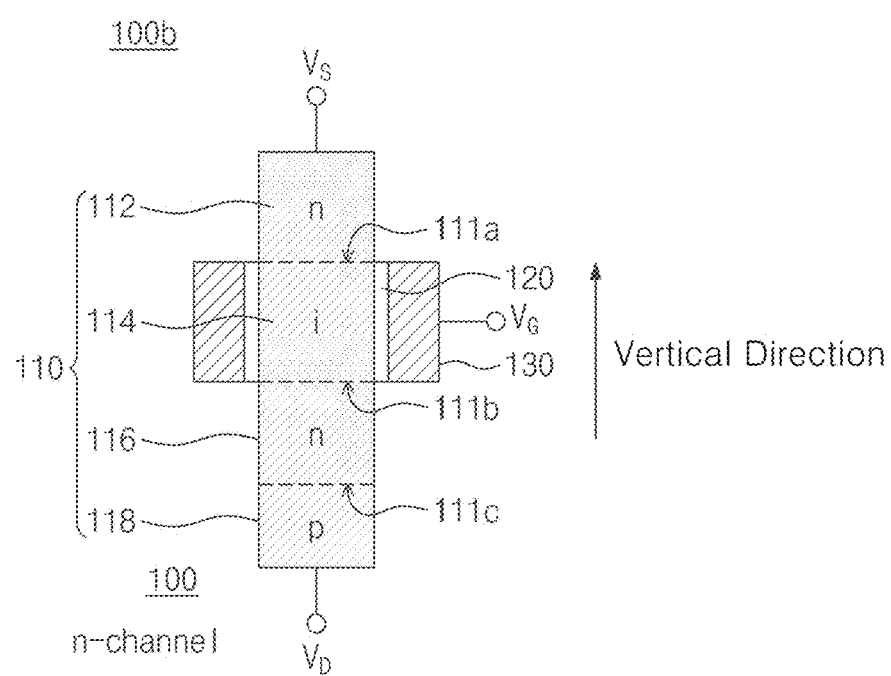
FIG. 1B is a structural drawing illustrating a basic structure of an n-channel semiconductor device according to another example embodiment of the present disclosure.

FIG. 1B is a structural drawing illustrating a basic structure of an n-channel semiconductor device according to another example embodiment of the present disclosure.

Figure 1C:
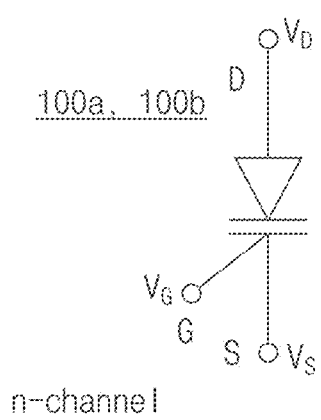
FIG. 1C shows a sign indicating the n-channel semiconductor device in FIGS. 1A and 1B.

FIG. 1C shows a sign indicating the n-channel semiconductor device in FIGS. 1A and 1B.

Referring to FIGS. 1A through 1C, each of semiconductor devices 100a and 100b includes a semiconductor column 110 including a first conductive region 112 of first conductivity type, a second conductive region 118 of second conductivity type, an intrinsic region 114 disposed between the first conductive region 112 and the second conductive region 118, a barrier region 116 of the first conductivity type disposed between the intrinsic region 114 and the second conductive region 118; a gate electrode 130 disposed to cover the intrinsic region 114; and a gate insulating layer 120 disposed between the gate electrode 130 and the intrinsic region 114. Each of the semiconductor devices 100a and 100b may operate as a switch or a volatile memory depending on a gate voltage applied to the gate electrode 130 and a drain voltage applied to the second conductive region 118.

Unlike a typical MOSFET, in the present disclosure, an n-channel semiconductor device 100a is doped with n-type impurities at opposite sides adjacent to the intrinsic region 114 of the semiconductor column 110. Meanwhile, a p-channel semiconductor device 100b is doped with p-type impurities at opposite sides adjacent to the intrinsic region 114 of the semiconductor column 110. In the n-channel semiconductor device 100a, the second conductive region 118 operates as a drain and the first conductive region 112 operates as a source. In the p-channel semiconductor device 100b, the first conductive region 112 operates as a drain and the second conductive region 118 operates as a source.

A substrate is a single-crystal silicon substrate, and the semiconductor column 110 may include polycrystalline or single-crystal silicon. The semiconductor column 110 may be doped with impurities of first conductivity type or second conductivity type according to a vertical position. The first conductivity type may be n-type, and the second conductivity type may be p-type. The first conductive region 112 of the semiconductor column 110 may be connected to a source electrode, and the second conductive region 118 thereof may be connected to a drain electrode. The gate insulating layer 120 may be disposed to cover the intrinsic region 114 and may include silicon oxide. A $p^+$-$n^+$-i-$n^+$ structure (or first conductive region-intrinsic region-barrier region-second conductive region) include a first p-n junction 111a, a second p-n junction 111b, and a third p-n junction 111c.

Returning to FIG. 1A, the semiconductor column 110 may be disposed to vertically extend on the substrate. The first conductivity type may be n-type, and the second conductivity type may be p-type. The first conductive region 112, the intrinsic region 114, the barrier region 116, and the second conductive region 118 may be sequentially disposed along the semiconductor column 110 as proceeding form a bottom surface to a top surface. The gate insulating layer 120 may be disposed to cover the intrinsic region 114, and the gate electrode 130 may be disposed over the intrinsic region 114 with the gate insulating layer 120 interposed therebetween to selectively only the intrinsic region 114.

Returning to FIG. 1B, the semiconductor column 110 may be disposed to vertically extend on the substrate. The first conductivity type may be n-type, and the second conductivity type may be p-type. The second conductive region 118, the barrier region 116, the intrinsic region 114, and the first conductive region 112 may be sequentially disposed along the semiconductor column 110 as proceeding from a bottom surface to a top surface. The gate insulating layer 120 may be disposed to cover the intrinsic region 114, and the gate electrode 130 may be disposed over the intrinsic region 114 with the gate insulating layer 120 interposed therebetween to selectively only the intrinsic region 114.

Figure 2A:
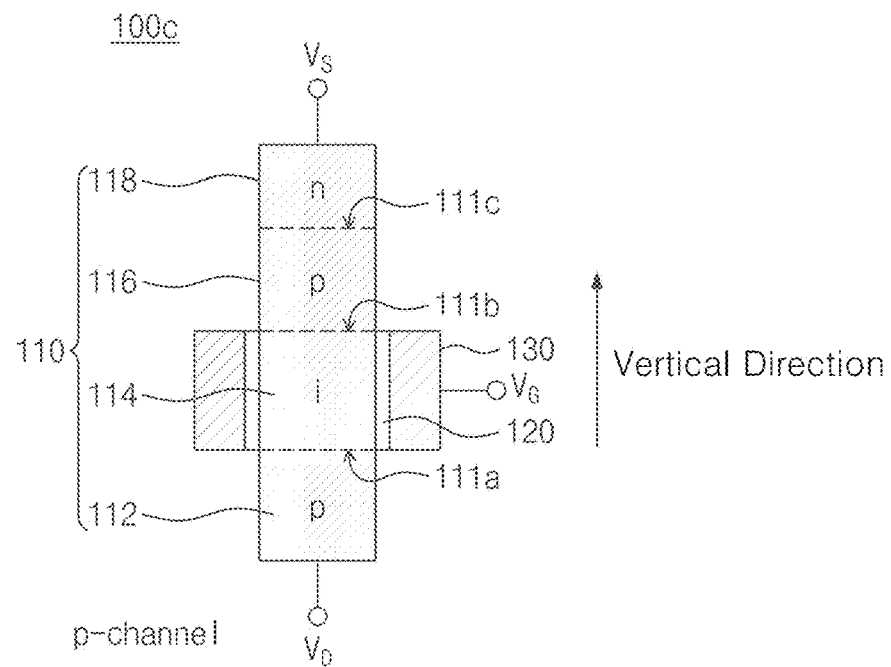
FIG. 2A is a structural drawing illustrating a basic structure of a p-channel semiconductor device according to an example embodiment of the present disclosure.

FIG. 2A is a structural drawing illustrating a basic structure of a p-channel semiconductor device according to an example embodiment of the present disclosure.

Figure 2B:
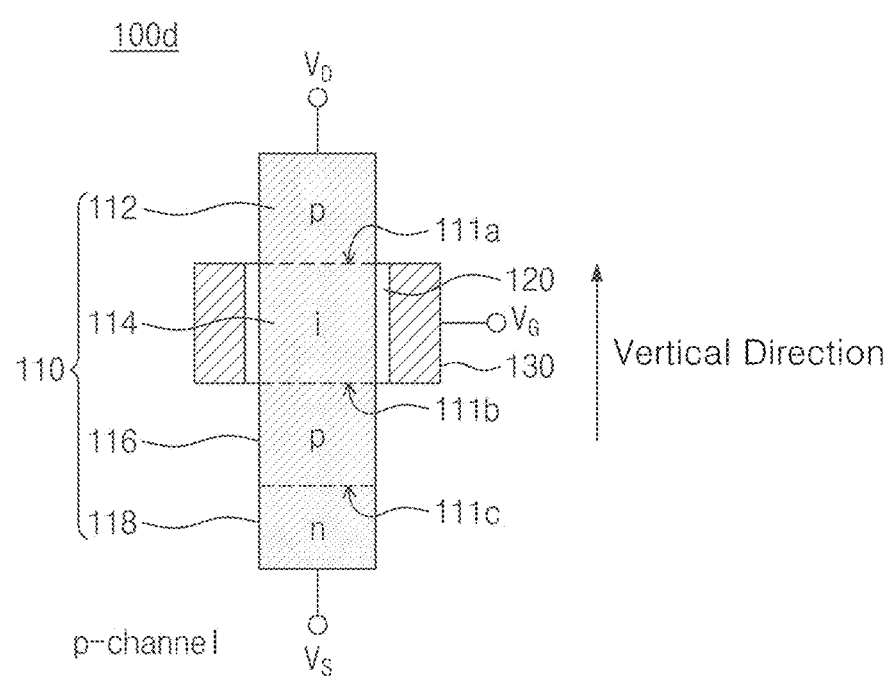
FIG. 2B is a structural drawing illustrating a basic structure of a p-channel semiconductor device according to another example embodiment of the present disclosure.

FIG. 2B is a structural drawing illustrating a basic structure of a p-channel semiconductor device according to another example embodiment of the present disclosure.

Figure 2C:
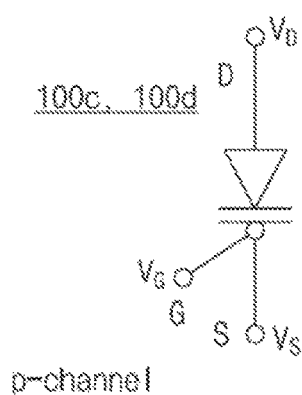
FIG. 2C shows a sign indicating the p-channel semiconductor device in FIGS. 2A and 2B.

FIG. 2C shows a sign indicating the p-channel semiconductor device in FIGS. 2A and 2B.

Referring to FIGS. 2A through 2C, each of semiconductor devices 100c and 100d includes a semiconductor column 110 including a first conductive region 112 of first conductivity type, a second conductive region 118 of second conductivity type, an intrinsic region 114 disposed between the first conductive region 112 and the second conductive region 118, and a barrier region 116 of the first conductivity type disposed between the intrinsic region 114 and the second conductive region 118; a gate electrode 130 disposed to cover the intrinsic region 114; and a gate insulating layer 120 disposed between the gate electrode 130 and the intrinsic region 114. Each of the semiconductor devices 100c and 100d may operate as a switch or a volatile memory depending on a gate voltage applied to the gate electrode 130 and a drain voltage applied to the first conductive region 112.

Returning to FIG. 2A, the semiconductor column 110 may be disposed to vertically extend on a substrate. The first conductivity type may be p-type, and the second conductivity type may be n-type. The first conductive region 112, the intrinsic region 114, the barrier region 116, and the second conductive region 118 may be sequentially disposed along the semiconductor column 110 as proceeding from a bottom surface to a top surface. The gate insulating layer 120 may be disposed to cover the intrinsic region 114, and the gate electrode 130 may be disposed on the intrinsic region 114 with the gate insulating layer 120 interposed therebetween to selectively cover only the intrinsic region 114.

Returning to FIG. 2B, the semiconductor column may be disposed to vertically extend on a substrate. The first conductivity type may be p-type, and the second conductivity type may be n-type. The second conductive region 118, the barrier region 116, the intrinsic region 114, and the first conductive region 112 may be sequentially disposed along the semiconductor column 110 as proceeding from a bottom surface to a top surface. The gate insulating layer 120 may be disposed to cover the intrinsic region 114, and the gate electrode 130 may be disposed on the intrinsic region 114 with the gate insulating layer 120 interposed therebetween to selectively cover only the intrinsic region 114.

The memory operation principle of a semiconductor device according to an example embodiment of the present disclosure will now be described below.

Figure 3:
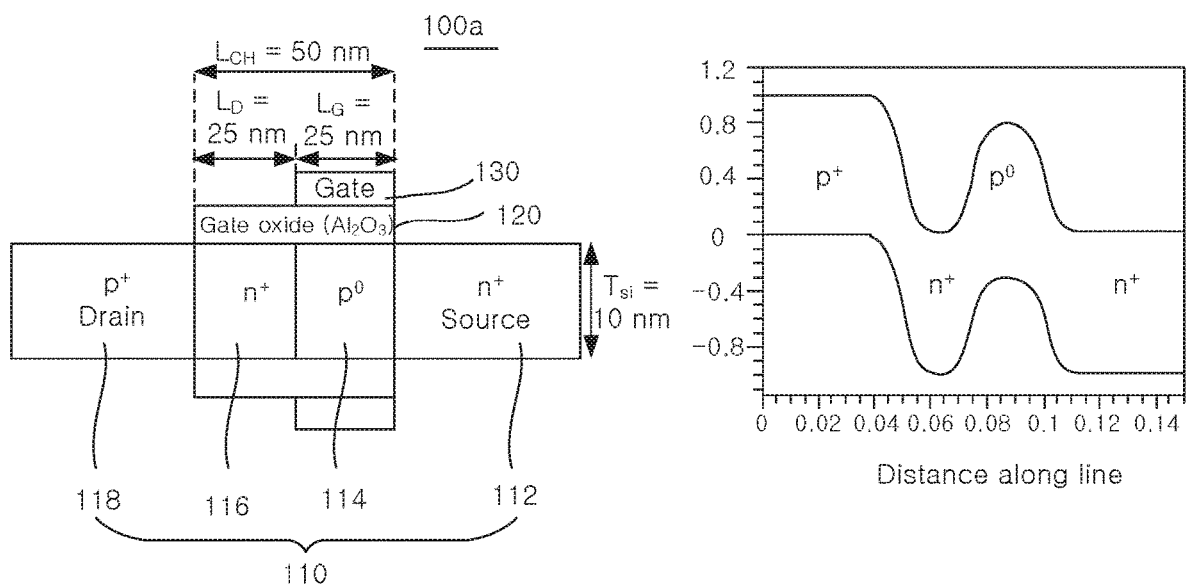
FIG. 3 illustrates a band diagram of an n-channel semiconductor device according to the present disclosure.

FIG. 3 illustrates a band diagram of an n-channel semiconductor device according to the present disclosure.

Figure 4:
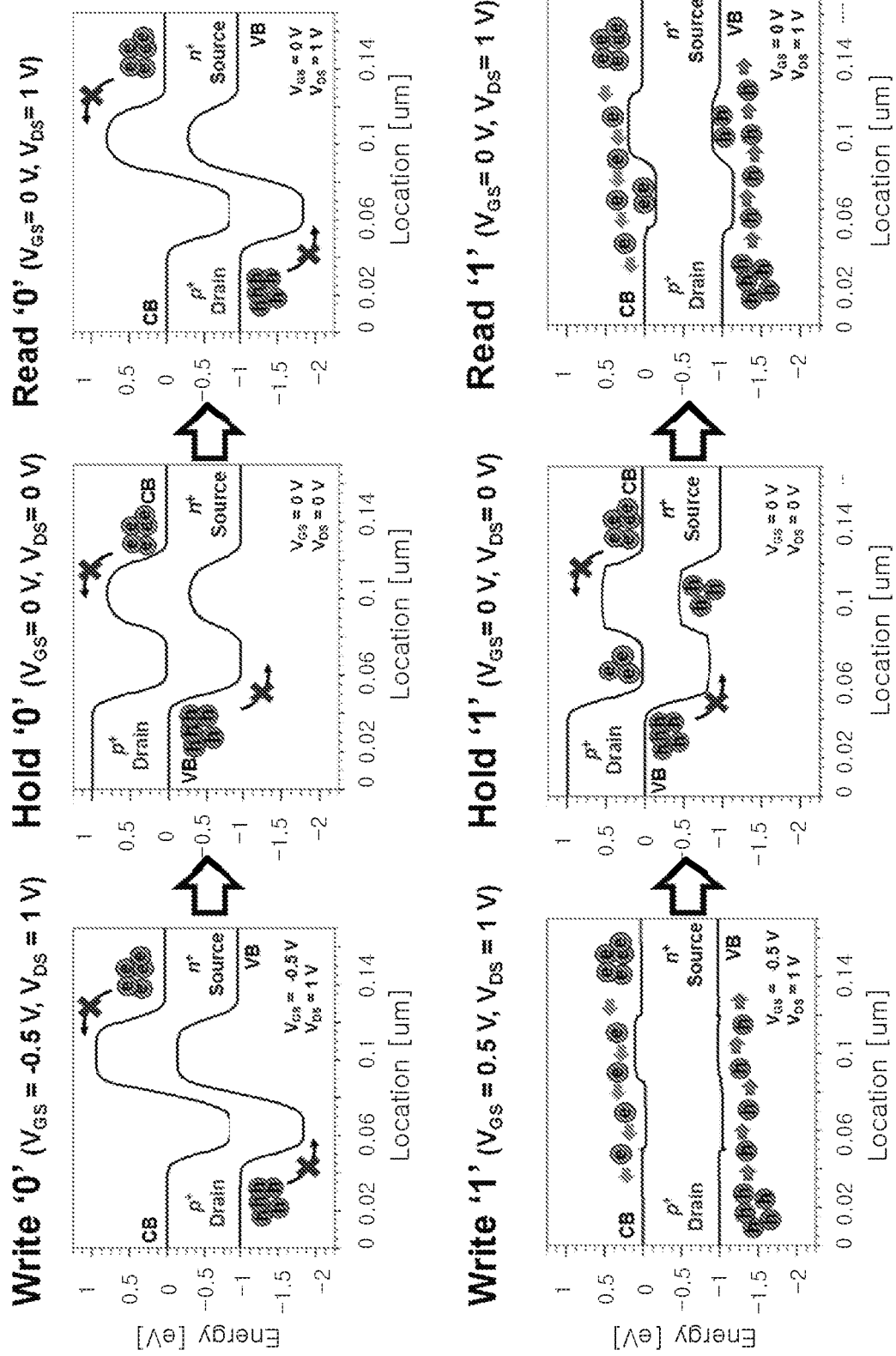
FIG. 4 illustrates a band diagram of a semiconductor column of the semiconductor device in FIG. 3.

FIG. 4 illustrates a band diagram of a semiconductor column of the semiconductor device in FIG. 3.

Figure 5:
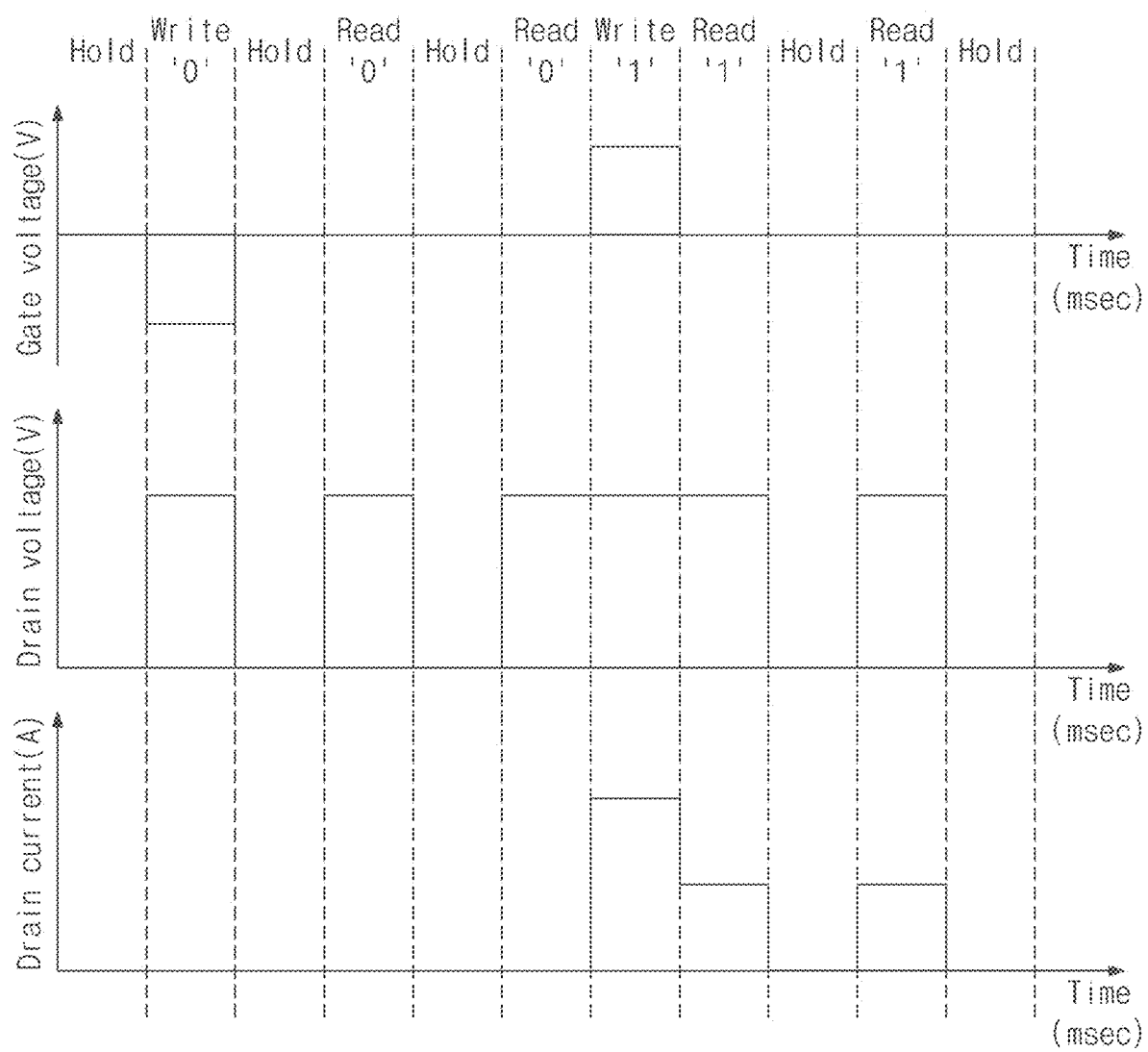
FIG. 5 is a timing diagram illustrating a voltage and current depending on a write operation, a hold operation, and a read operation of the semiconductor device in FIG. 4.

FIG. 5 is a timing diagram illustrating a voltage and current depending on a write operation, a hold operation, and a read operation of the semiconductor device in FIG. 4.

Figure 6A:
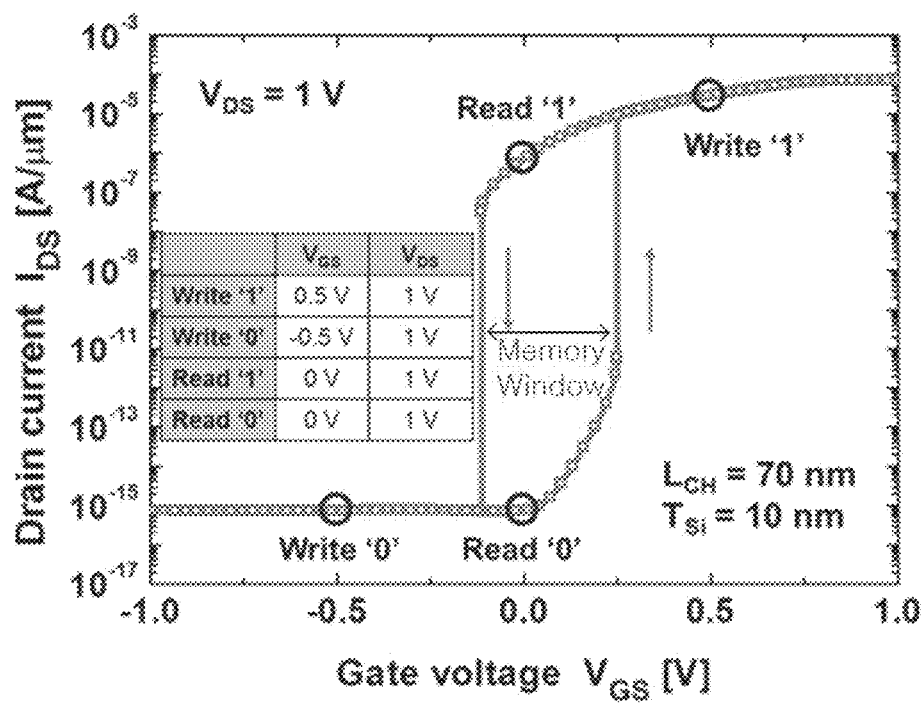
FIG. 6A is a graph showing a simulation result illustrating drain current depending on a gate voltage of the semiconductor device.

FIG. 6A is a graph showing a simulation result illustrating drain current depending on a gate voltage of the semiconductor device.

Figure 6B:
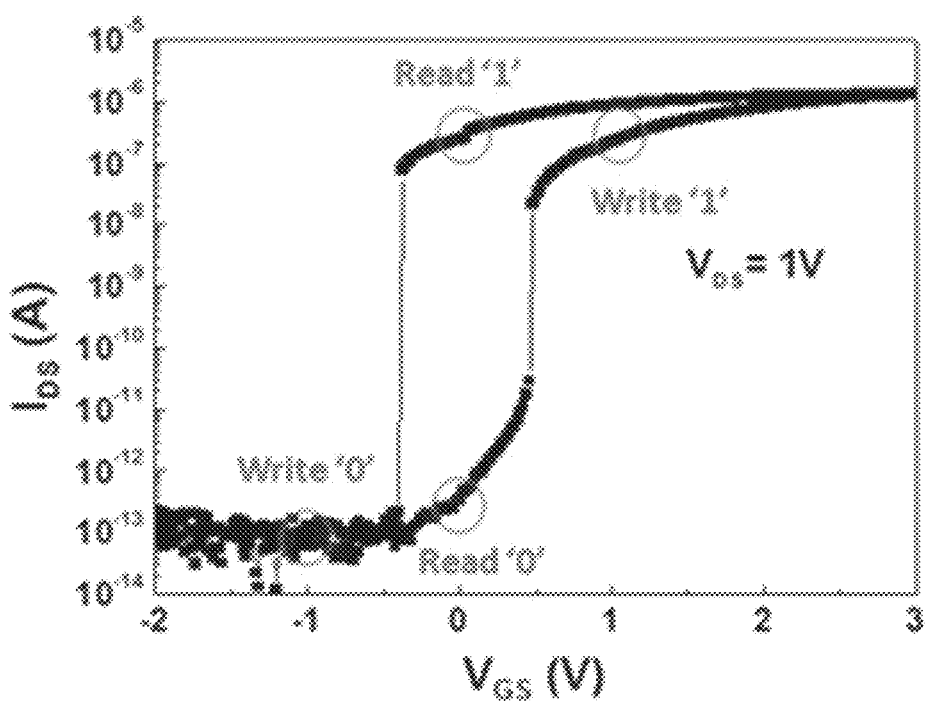
FIG. 6B is a graph showing a test result illustrating drain current depending on a gate voltage of the semiconductor device.

FIG. 6B is a graph showing a test result illustrating drain current depending on a gate voltage of the semiconductor device.

Referring to FIGS. 3 through 6, each of semiconductor devices 100a and 100b includes a p-n-i-n structure or a p-n-p-n structure. An intrinsic region 114 may be lightly doped ($p^0$) in an intrinsic state or with impurities of second conductivity type. A second conductive region 118 may be heavily doped ($p^+$) with the impurities of second conductivity type. A first conductive region 112 may be heavily doped ($n^+$) with impurities of first conductivity type. A barrier region 116 may be heavily doped ($n^+$) with the impurities of first conductivity type.

When a voltage is not applied to a gate electrode 130 and there is no potential difference between the second conductive region 118 and the first conductive region 112, all regions have the same Fermi level.

In a $p^+$-$n^+$-$p^0$-$n^+$ structure, the second conductive region 118 is in a $p^+$ state, the first conductive region 112 is in an $n^+$ state, the intrinsic region 114 is in a $p^0$ state, and the barrier region 116 is in an $n^+$ state, where the superscript "+" means heavy doping and the subscript "0" means light doping. The $p^+$-$n^+$-$p^0$-$n^+$ structure includes a first p-n junction 111a, a second p-n junction 111b, and a third p-n junction 111c.

A memory device according to an example embodiment of the present invention may perform a write operation, a read operation, and a hold operation to hold a state made by the write operation. Thus, the semiconductor device 100 may operate as a memory. A gate G is interchangeable with a gate electrode, a source S is interchangeable with a source electrode, and a drain D is interchangeable with a drain electrode.

In a memory, a logic state may be indicated as a first logic state ("0") and a second logic state ("1"). For example, to write the logic "0" state, when a first gate voltage ($V_{GsS}$=−0.5V) is applied to the gate electrode 130 and a drain voltage ($V_{DS}$=1V) is applied to the drain, an energy barrier of the third p-n junction 111c increases to make it difficult for electrons in conduction band to pass the energy barrier. In addition, an energy barrier of the first p-n junction 111a increases to make it difficult for holes in valence band to pass the energy barrier. Thus, drain current $I_{DS}$ hardly flows through the semiconductor column 110.

To maintain the logic "0" state, a second gate voltage ($V_{GS}$=0V) may be applied to the gate electrode 130 and a second drain voltage ($V_{DS}$=0V) may be applied to the drain. Even in this case, the drain current $I_{DS}$ flowing through the semiconductor column 110 hardly flows due to the energy barrier.

To read the logic "0" state, a second gate voltage ($V_{GS}$=0V) may be applied to the gate electrode 130 and a first drain voltage ($V_{DS}$=1V) may be applied to the drain. Even in this case, the drain current $I_{DS}$ flowing through the semiconductor column 110 hardly flows due to the energy barrier. Thus, a current detection circuit (not shown) connected to the drain may check the logic "0" state.

To write the logic "1" state, a third gate voltage ($V_{GS}$=0.5V) may be applied to the gate electrode 130 and a first drain voltage ($V_{DS}$=1V) may be applied to the drain. In this case, the energy barrier of the first p-n junction 111a is lowered and the energy barrier of the third p-n junction 111c is also lowered. Thus, electrons and holes may flow through the semiconductor column 110.

To maintain the logic "1" state, a second gate voltage ($V_{GS}$=0.0V) may be applied to the gate electrode 130 and a second drain voltage ($V_{DS}$=0V) may be applied to the drain. In this case, a conduction band energy well is formed between the first p-n junction 111a and the second p-n junction 111b and electrons are bound. In addition, a valence band energy well is formed between the second p-n junction 111b and the third p-n junction 111c and holes are bound. The first p-n junction 111a and the third p-n junction 111c provide a sufficient energy barrier, so the drain current $I_{DS}$ hardly flows.

To read the logic "1" state, a second gate voltage ($V_{GS}$=0.0V) may be applied to the gate electrode 130 and a first drain voltage ($V_{DS}$=1V) may be applied to the drain. Electrons bound to a conduction band energy well between the first p-n junction 111a and the second p-n junction 111b change an energy band to lower an energy barrier. In addition, holes bound to a valence band energy well between the second p-n junction 111b and the third p-n junction 111c change an energy band to lower an energy barrier. Thus, the drain current $I_{DS}$ flows through the semiconductor column 110.

Referring to FIG. 6A, an on/off current ratio is not more than $10^{10}$ and a subthreshold swing (SS) is about 0.1 mV/dec. Drain current depending on a gate voltage exhibits hysteresis and exhibits capacitorless memory characteristics according to a predetermined operation condition. A first gate voltage for writing the logic "0" state may be −0.5V.

A second gate voltage for reading each state may be 0V, and a third gate voltage for writing the logic "1" state may be 0.5V.

An on/off current ratio is $10^{10}$, and a subthreshold swing (SS) is about 0.1 mV/dec. Drain current depending on a gate voltage exhibits hysteresis and exhibits memory characteristics or switch characteristics according to an operation condition.

The semiconductor device 100 may be used as a capacitorless RAM. Hereinafter, a structure and an operating method of a capacitorless RAM will now be described below in detail.

In a $p^+$-$n^+$-$p^0$-$n^+$ structure ($p^+$-$n^+$-i-$n^+$ structure), the first gate voltage may be between −0.25V and −1V (e.g., −0.5V), the second gate voltage may be between −0.1V and 0.1V (e.g., 0V), and the third gate voltage may be between 0.25V and 1V (e.g., 0.5V). The first drain voltage may be between 1V and 2V (e.g., 1V), and the second drain voltage may be 0V.

In the semiconductor device 100, the energy barrier has a structure such as p-n-p-n (or p-n-i-n) due to a potential barrier formed in the semiconductor column 110. While charges are injected under a specific bias condition, some of the charges are accumulated in a channel. Accordingly, the potential barrier rapidly disappears and, at the same time, a positive feedback loop is formed in the channel. This phenomenon causes memory window characteristics during operation of a memory device, and a memory window may be maintained while there are the charges accumulated in the channel.

Referring to FIG. 6B, an on/off current ratio is not more than $10^7$ and a subthreshold swing (SS) is about 0.1 mV/dec. Drain current depending on a gate voltage exhibits hysteresis and exhibits capacitorless memory characteristics according to a predetermined operation condition. A first gate for writing a logic "0" state may be −1V. A second gate voltage for reading each state may be 0V, and a third gate voltage for writing a logic "1" state may be 1V.

Figure 7:
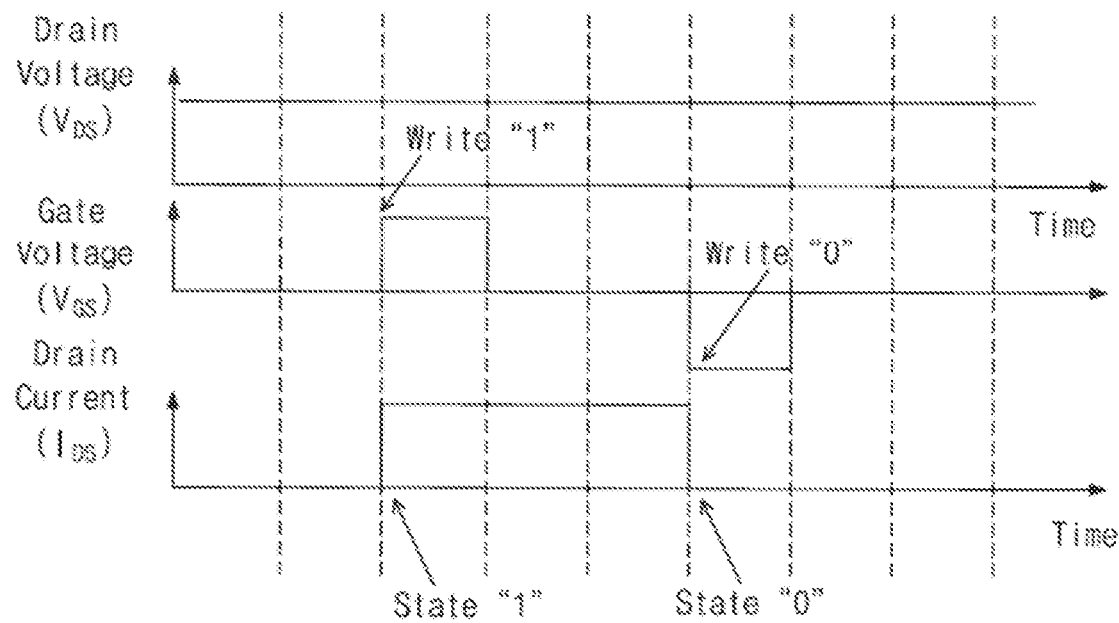
FIG. 7 is a timing diagram illustrating a switching operation according to an example embodiment of the present disclosure.

FIG. 7 is a timing diagram illustrating a switching operation according to an example embodiment of the present disclosure.

Figure 8:
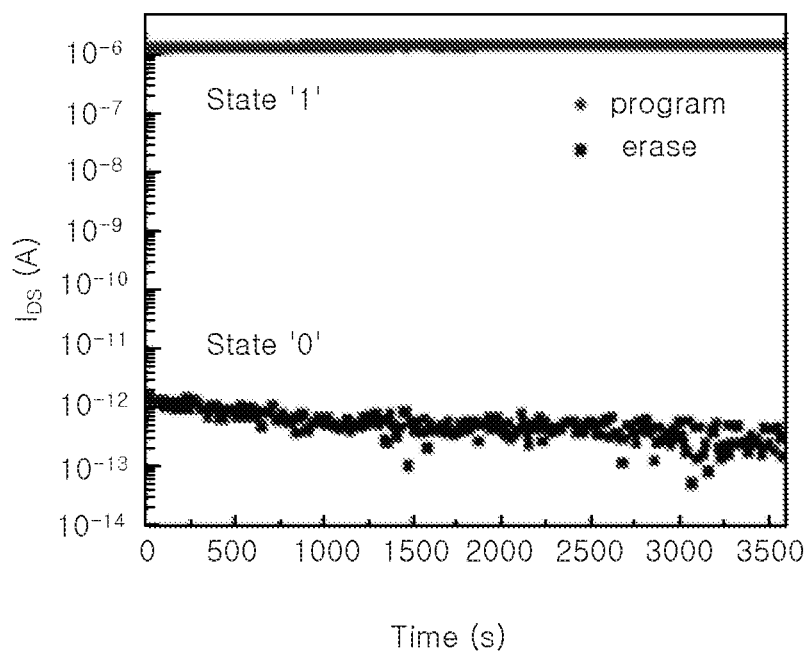
FIG. 8 shows a test result illustrating durations of a logic "1" state and a logic "0" state depending on an operating voltage in FIG. 7.

FIG. 8 shows a test result illustrating durations of a logic "1" state and a logic "0" state depending on an operating voltage in FIG. 7.

Figure 9:
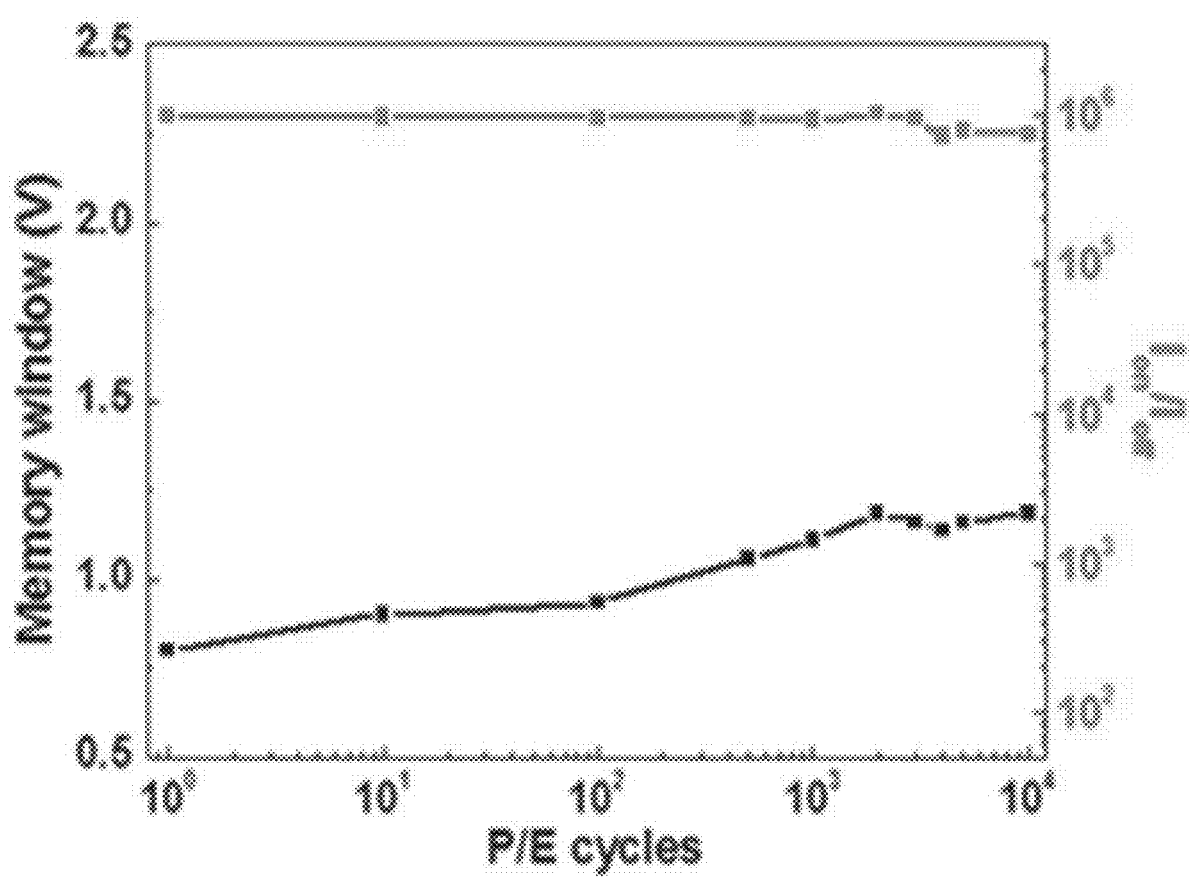
FIG. 9 shows a test result illustrating a ratio of on-current to off-current (Ion/Ioff) depending on program/erase operation cycles and a memory window.

FIG. 9 shows a test result illustrating a ratio of on-current to off-current (Ion/Ioff) depending on program/erase operation cycles and a memory window.

Referring to FIG. 1A and FIGS. 7 through 9, each of the semiconductor devices 100a and 100b may operate as a switch. Each of the semiconductor devices 100a and 100b includes a semiconductor column 110 including a first conductive region of first conductivity type, a second conductive region 118 of second conductivity type, an intrinsic region 141 disposed between the first conductive region 112 and the second conductive region 118, and a barrier region 116 of the first conductivity type disposed between the intrinsic region 114 and the second conductive region 118; a gate electrode 130 disposed to cover the intrinsic region 114; and a gate insulating layer 120 disposed between the gate electrode 130 and the intrinsic region 114. Each of the semiconductor devices 100a and 100b may operate as a switch depending on a gate voltage applied to the gate electrode 130 and a drain voltage applied to the second conductive region 118. While a first drain voltage (e.g., $V_{DS}$=1V) is applied to the second conductive region 118, a positive first gate pulse is applied to the gate electrode 130 to switch to a first state (ON state). While the first drain voltage is applied to the second conductive region 118, a negative second gate pulse is applied to the gate electrode 130 to switch from the first state (ON state) to a second state (OFF state).

To write a logic "1" state (program operation), the first gate voltage ($V_{GS}$=1V) is applied to the gate electrode 130 while the first drain voltage (e.g., $V_{DS}$=1V) is applied to the second conductive region 118. Thus, the drain current $I_{DS}$ switches to the first state (ON state) and is maintained in the first state even when the gate voltage $V_{GS}$ changes into a reference voltage ($V_{GS}$=0V).

To write a logic "0" state (erase operation), the second gate voltage ($V_{GS}$=−1V) is applied to the gate electrode 130 while the first drain voltage ($V_{DS}$=1V) is applied to the second conductive region 118. Thus, the drain current $I_{DS}$ switches to the second state (OFF state) and is maintained in the second state (OFF state) even when the gate voltage changes into the reference voltage ($V_{GS}$=0V).

After the positive first gate pulse is applied to the gate electrode 130, the gate electrode 130 switches to a reference voltage ($V_{GS}$=0V) state. In this case, the drain current $I_{DS}$ is maintained in the logic "1" state for an hour or longer while the first drain voltage (e.g., $V_{DS}$=1V) is applied.

After the negative second gate pulse is applied to the gate electrode 130, the gate electrode 130 switches to a reference voltage ($V_{GS}$=0) state. In this case, the drain current is maintained in the logic "0" state for an hour or longer while the first drain voltage (e.g., $V_{DS}$=1V) is applied.

After a cycle of a program operation of logic "1" state and an erase operation of logic "0" state is repeated $10^4$ times, the ratio of the on-current to the off-current constantly remains at a level of about $10^6$. A difference between a gate voltage at which latch-up occurs and a gate voltage at which latch-down occurs (window memory) remains almost constantly after the cycle of the program operation of logic "1" state and the erase operation of logic "0" state is repeated $10^4$ times.

Figure 10:
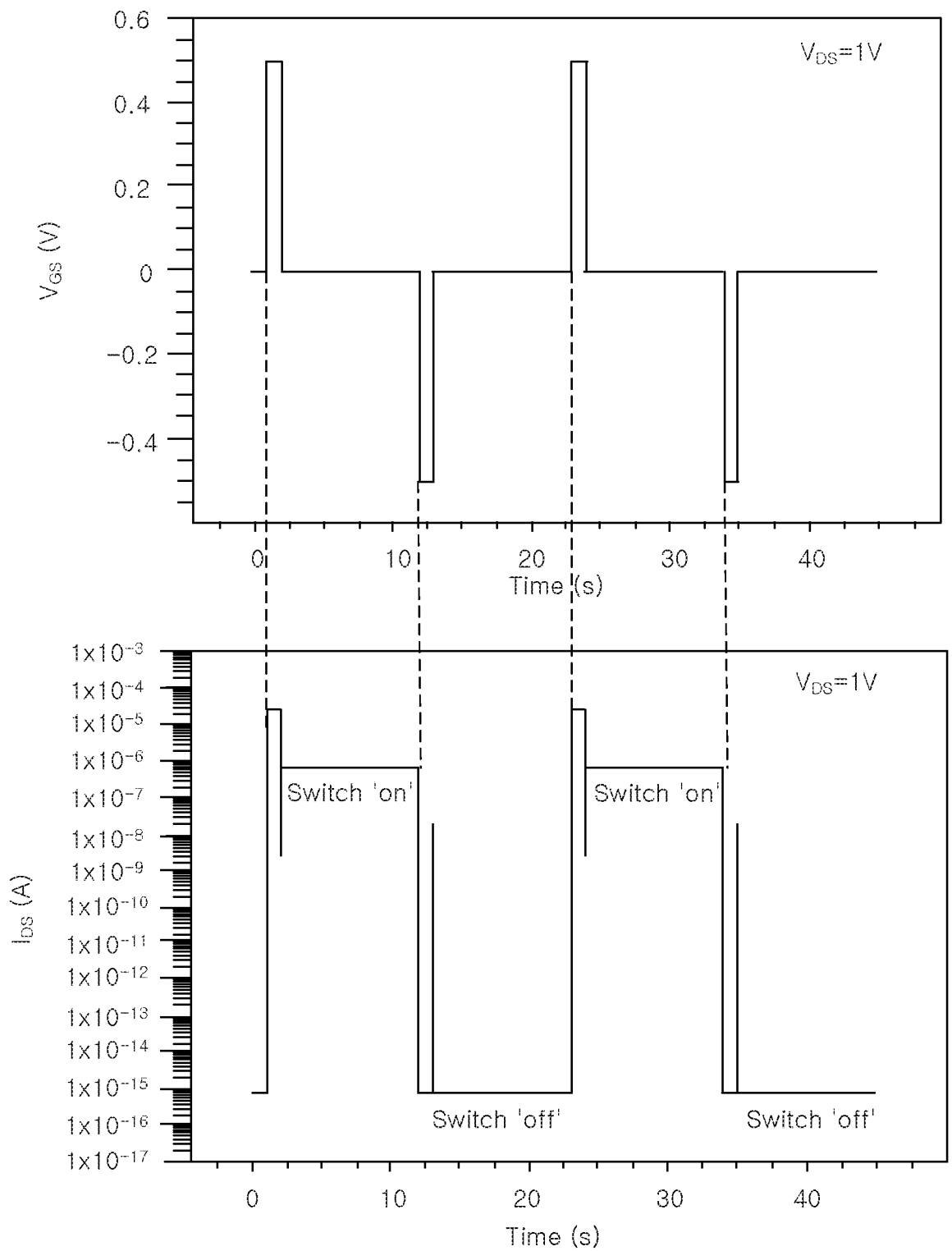
FIG. 10 shows a simulation result illustrating a switching operation of a semiconductor device according to an example embodiment of the present disclosure.

FIG. 10 shows a simulation result illustrating a switching operation of a semiconductor device according to an example embodiment of the present disclosure.

Referring to FIGS. 1A and 10, each of the semiconductor devices 100a and 100b may be used as a switch. When a positive first gate pulse (e.g., 0.5V) is applied to the gate electrode 130 while a first drain voltage (e.g., $V_{DS}$=1V) is applied to the second conductive region 118, drain current $I_{DS}$ is turned on (logic "1" state) by the positive first gate pulse and is not more than $10^{-4}$ ampere. When a reference voltage (0V) is applied to the gate electrode 130 after the first gate pulse is applied, the drain current $I_{DS}$ remains at a level of $10^{-6}$ ampere.

To turn off the semiconductor devices 100a and 100b, when a negative second gate pulse (e.g., −0.5V) is applied to the gate electrode 130 while a first drain voltage (e.g., $V_{DS}$=1V) is applied to the second conductive region 118, the drain current $I_{DS}$ is turned off (logic "0" state) by the negative second gate pulse and is not more than $10^{15}$ ampere. When the reference voltage (0V) is applied to the gate electrode 130 after the negative second gate pulse is applied, the drain current $I_{DS}$ remains at a level of $10^{-15}$ ampere.

The logic "0" state is maintained for an hour or longer while the reference voltage (0V) is applied to the gate electrode 130. The logic "1" state is maintained for an hour or longer while the reference voltage (0V) is applied to the gate electrode 130.

According to modified embodiments, a semiconductor column of the semiconductor device may be modified to a p-channel component of an $n^+$-$p^+$-i-$p^+$ structure.

Hereinafter, a structure and an operating method of a capacitorless RAM will now be described below in detail.

Figure 11:
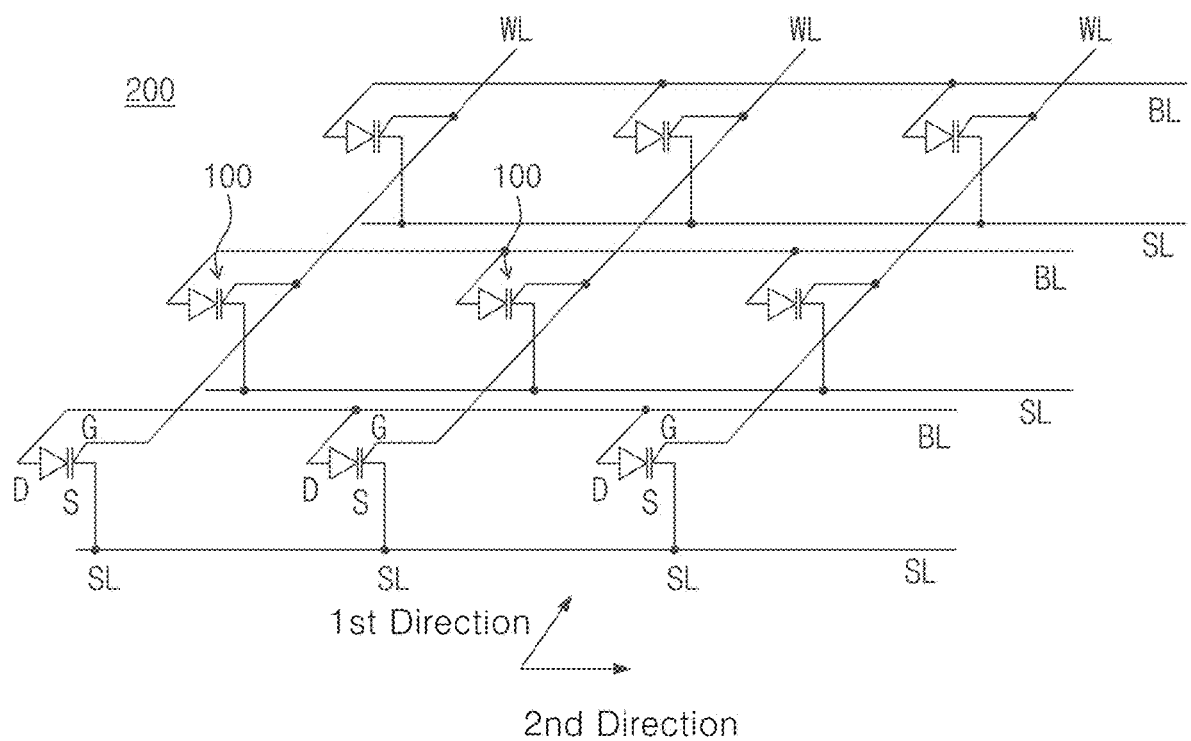
FIG. 11 is a circuit diagram of a capacitorless RAM according to an example embodiment of the present disclosure.

FIG. 11 is a circuit diagram of a capacitorless RAM according to an example embodiment of the present disclosure.

Figure 12:
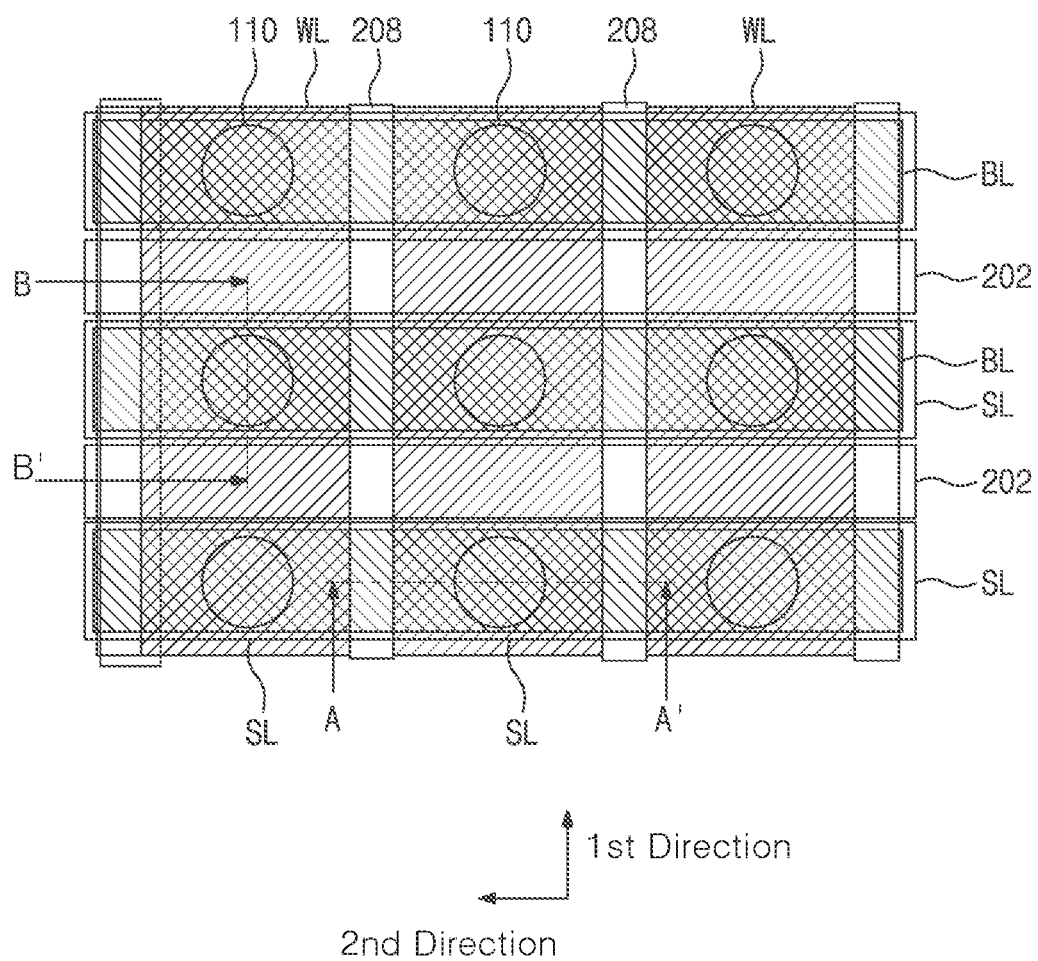
FIG. 12 is a top plan view of a cell region of the capacitorless RAM in FIG. 11.

FIG. 12 is a top plan view of a cell region of the capacitorless RAM in FIG. 11.

Figure 13:
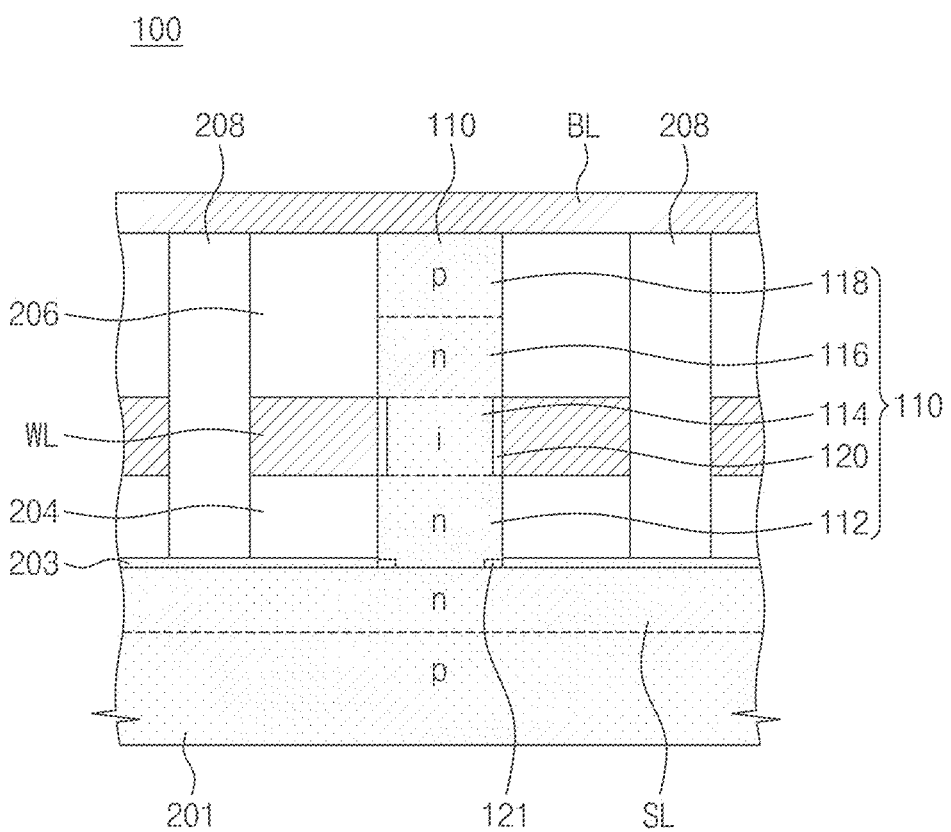
FIG. 13 is a cross-sectional view taken along a line A-A' in FIG. 12.

FIG. 13 is a cross-sectional view taken along a line A-A' in FIG. 12.

Figure 14:
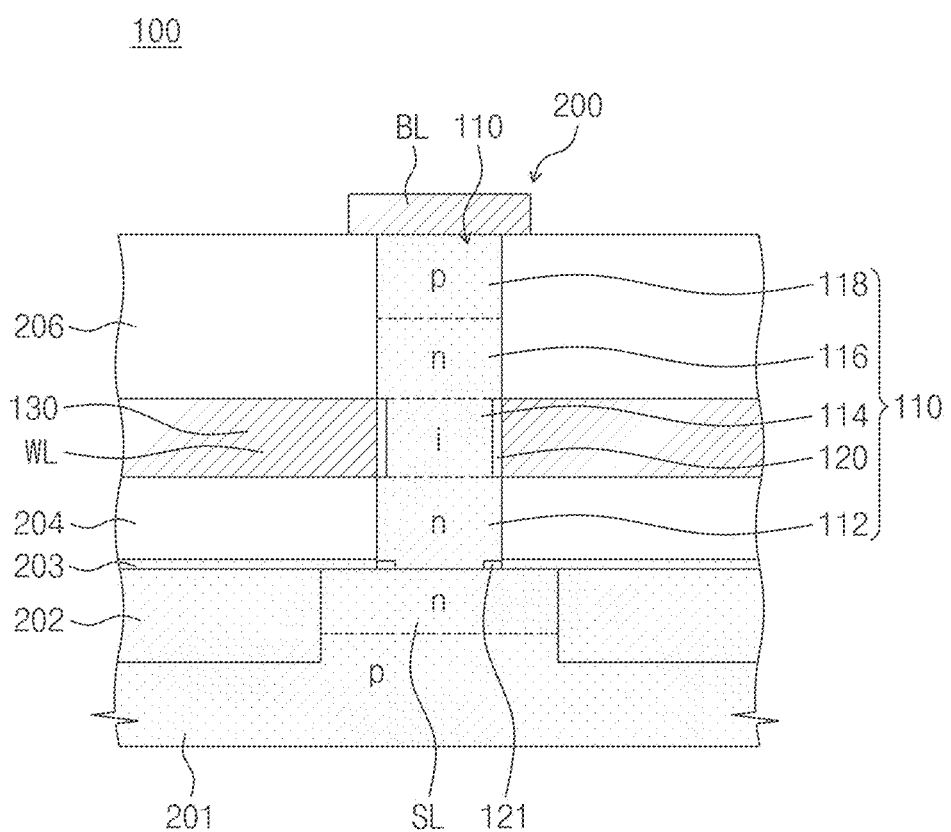
FIG. 14 is a cross-sectional view taken along a line B-B' in FIG. 12.

FIG. 14 is a cross-sectional view taken along a line B-B' in FIG. 12.

FIGS. 15A through 15G are cross-sectional views taken along the line A-A' in FIG. 12 according to process steps.

Referring to FIGS. 11 through 14 and FIGS. 15A through 15G, a random access memory (RAM) 200 includes a substrate 201 having a placement plane defined by a first direction and a second direction perpendicular to the first direction; source lines SL extending on the substrate 210 parallel to each other in the second direction; semiconductor columns 110 periodically disposed on the source lines SL and extending vertically on the placement plane of the substrate 201; wordlines WL disposed to cover side surfaces of the semiconductor columns 110 arranged in the first direction and extending in the first direction; a gate insulating layer 120 disposed between the semiconductor column 110 and the wordline WL to cover a side surface of the semiconductor column 110; wordline isolation layers 208 extending in the first direction and filling spaces between the wordlines WL; and bitlines BL extending in the second direction in contact with top surfaces of the semiconductor columns 110 arranged in the second direction.

The semiconductor column 110 includes a first conductive region 112 of first conductivity type, a second conductive region 118 of second conductivity type, an intrinsic region 114 disposed between the first conductive region 112 and the second conductive region 118, and a barrier region 116 of the first conductivity type disposed between the intrinsic region 114 and the second conductive region 118. The first conductive region 112 is in contact with a source line SL, and the second conductive region 118 is in contact with the bitline BL.

The RAM 200 includes a plurality of unit semiconductor devices 100. The unit semiconductor device 100 may be an n-channel semiconductor device 100a or 100b.

According to modified embodiments, the unit semiconductor device 100 may be a p-channel semiconductor device 100c or 100d.

The unit semiconductor devices 100 are arranged in a matrix format, and the semiconductor column 110 of the unit semiconductor device 100 extends vertically from the substrate 201. The unit semiconductor device 100 is a three-terminal device including a gate G, a source S, and a drain D. A gate of the unit semiconductor device 100 disposed in a first direction is connected to the wordline WL. A drain of the unit semiconductor device 100 disposed in a second direction is connected to a bitline BL. A source of the unit semiconductor device 100 disposed in the second direction is connected to the source line SL. If a single wordline WL and a single bitline BL are selected to apply a voltage corresponding to a write operation, a hold operation or a read operation when the source line SL is grounded, each unit semiconductor cell 100 may be accessed.

The unit semiconductor device 100 includes a semiconductor column 110, a gate electrode 130, and a gate insulating layer 120. The semiconductor column 110 extends vertically on a substrate 201 and includes a first conductive region 112 of first conductivity type, a second conductive region 118 of second conductivity type, an intrinsic region 114 disposed between the first conductive region 112 and the second conductive region 118, and a barrier region 114 of the first conductivity type disposed between the intrinsic region 114 and the second conductive region 118. The gate electrode 130 is disposed to cover the intrinsic region 114. The gate insulating layer 120 is disposed between the gate electrode 130 and the intrinsic region 114. Gate electrodes 130 are connected on the same plane in the second direction to form a wordline WL.

The capacitorless RAM 200 includes device isolation layers 202, source lines SL, semiconductor columns 110, wordlines WL, a gate insulating layer 120, gate isolation layers 208, and a bitline BL. The gate electrode 130 may be commonly used in a plurality of unit semiconductor devices arranged in the first direction to constitute a wordline WL.

The device isolation layers 202 extend parallel to each other on the substrate 201 in the second direction. The source lines SL has the same top surface as the device isolation layer 202, is disposed between the device isolation layers 202, and extends parallel to each other in the second direction. The semiconductor columns 110 are periodically arranged on the source lines SL and extend vertically on the substrate 201. The wordlines WL are disposed to cover side surfaces of the intrinsic regions 114 of the semiconductor columns 110 arranged in the first direction and extend in the first direction. The gate insulating layer 120 is disposed between the semiconductor column 110 and the wordline WL to cover a side surface of the intrinsic region 114 of the semiconductor column 110. The gate isolation layers 208 extend in the first direction, isolate the wordlines WL, and fill spaces between the wordlines WL. The bitline BL extends in the second direction in contact with top surfaces of the semiconductor columns arranged in the second direction perpendicular to the first direction.

The semiconductor column 110 may include a first conductive region 112 of first conductivity type, an intrinsic region 114, a barrier region of the first conductivity type, and a second conductive region 118 of second conductivity type which are sequentially stacked. The first conductive region 112 is in contact with the source line SL, and the second conductive region 118 is in contact with the bitline BL. The first conductivity type may be n-type, and the second conductivity type may be p-type. The first conductive region 112 may be a source, and the second conductive region 118 may be a drain.

The substrate 201 may be a silicon substrate. The substrate 201 may be divided into a cell region in which unit memory cells are formed and a peripheral circuit region in which peripheral circuits are disposed.

The device isolation layers 202 may include silicon oxide. The device solation layers 202 may be formed by means of shallow trench isolation (STI). The source lines SL may correspond to an active region defined by the STI. The source lines SL may be formed by doping the active region with impurities of the first conductivity type.

The semiconductor columns 110 may include silicon and may be formed by means of chemical vapor deposition (CVD) or epitaxial growth. The semiconductor columns 110 may be grown and simultaneously doped to have a p-n-i-n structure (n-channel structure) or an n-p-i-p structure (p-channel structure). The wordlines WL may include at least one of heavily doped polysilicon, metal, metal-alloy, and metal silicide. The gate insulating layer 120 may include silicon oxide or silicon oxynitride. The gate isolation layers 208 may include silicon oxide or silicon nitride. The bitline BL may include at least one of heavily doped polysilicon, metal, metal-alloy, and metal silicide.

A method of fabricating the capacitorless RAM 200 will now be described. A device isolation layer 202 extending in a second direction is formed in a substrate 201, which has a placement plane defined by a first direction and the second direction perpendicular to the first direction, to define an active region. A first interlayer dielectric 204, a doped silicon layer 205, and a second interlayer dielectric 206 are stacked on the substrate 201 where the active region is formed, and a through-hole is formed 110 through the second interlayer dielectric 206, the doped silicon layer 205, and the first interlayer dielectric 204. A gate insulating layer 120 is formed on an exposed surface of the doped silicon layer 205 within the through-hole 101. A semiconductor column 110 including a first conductive region 112 of first conductivity type, an intrinsic region 114, a barrier region 116 of the first conductivity type, and a second conductive region 118 of second conductivity type is formed in the through-hole 110a. A trench 208a penetrating the second interlayer dielectric 206 and the doped silicon layer 205 and extending in the first direction is formed with the semiconductor columns 110, which are arranged in the first direction, interposed therebetween. The trench 208a is filled with a wordline isolation layer 208. A bitline is formed to be in contact with the second conductive region 118 of the semiconductor column 110 and to extend in the second direction.

To remove an auxiliary insulating layer 121 formed on the active region when the gate insulating layer 120 is formed, a sacrificial insulating layer may be formed to cover a sidewall of the through-hole 110a. The sacrificial insulating layer is anisotropically etched to form a sacrificial sidewall 122 and to remove the auxiliary insulating layer 121. The sacrificial sidewall 122 may be selectively removed.

Figure 15A:
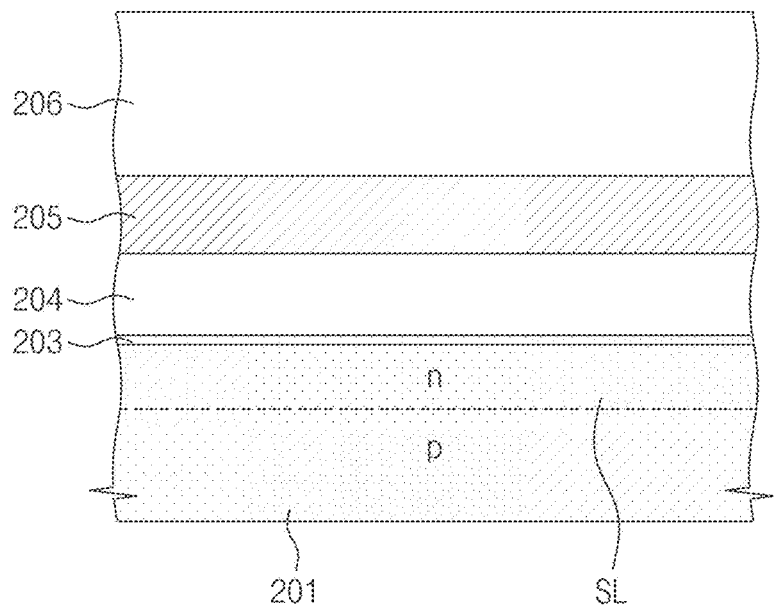
FIGS. 15A through 15G are cross-sectional views taken along the line A-A' in FIG. 12 according to process steps.

Referring to FIG. 15A, a device isolation layer 202 extending in a second direction is formed on the substrate 201 to define an active region. A cell region and a peripheral circuit region are distinguished and an ion implantation process is performed using masks to form wells in the cell region and the peripheral circuit region, respectively.

The substrate 210 may be a silicon substrate. In the cell region, a device isolation layer 201 extending in the second direction is formed on the substrate 201. The device isolation layer 201 and the active region may be formed by means of a conventional STI process. The active region is an exposed region between adjacent device isolation layers 202 and may be heavily doped with impurities of the first conductivity type by an ion implantation process. Thus, the active region may be doped with impurities to form the source line SL. The device isolation layer 202 may include silicon nitride, and a silicon nitride layer may be formed on top surfaces of the device isolation layer 202 and the active region as an etch-stop layer 203.

A first interlayer dielectric 204, a doped silicon layer 205, and a second interlayer dielectric 206 are sequentially stacked on the substrate 201 where the source line SL is formed. The first interlayer dielectric 204 and the second interlayer dielectric 206 may include silicon oxide, and the doped silicon layer 205 may include heavily doped silicon. A thickness of the second interlayer dielectric 206 may be greater than that of the first interlayer dielectric 204 or the doped silicon layer 205.

Figure 15B:
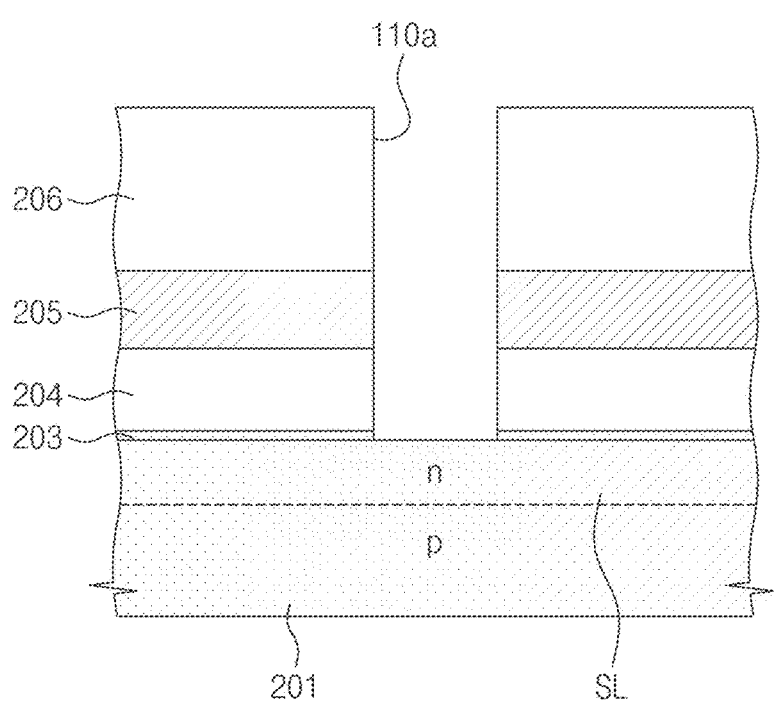

Referring to FIG. 15B, by using a patterning process, a through-hole 110a is formed through the second interlayer dielectric 206, the doped silicon layer 205, the first interlayer dielectric 204, and the etch-stop layer 203. The through-hole 110a may expose the active region or the source line SL and may be periodically arranged on the source line SL in a matrix format.

Figure 15C:
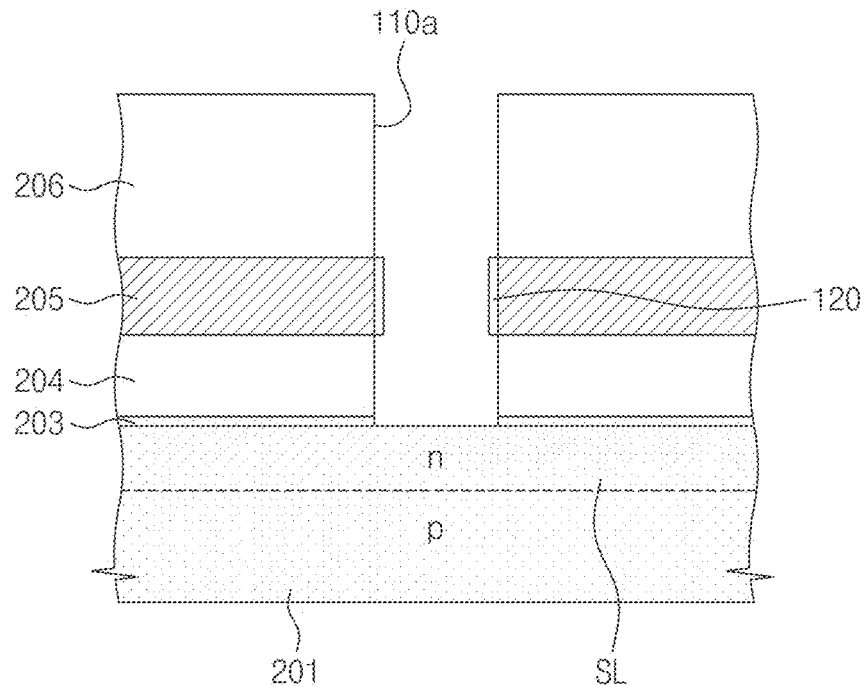

Referring to FIG. 15C, a gate insulating layer 120 is formed on a surface of the exposed doped silicon layer 205 within the through-hole 110a. The gate insulating layer 120 may include silicon oxide formed by thermal oxidation. In this case, an auxiliary insulating layer 121 may be formed on the exposed source line SL.

Figure 15D:
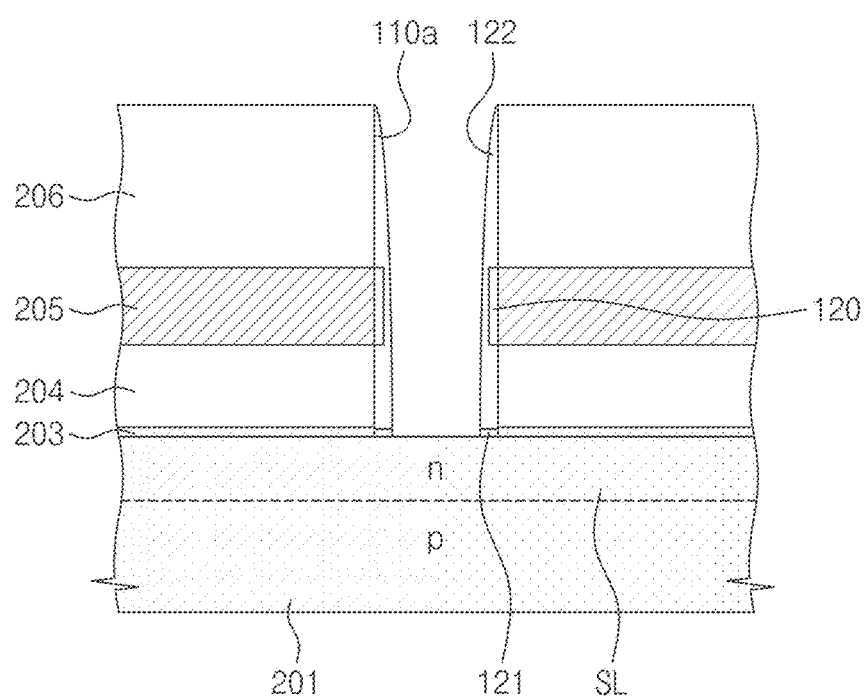
Figure 15E:
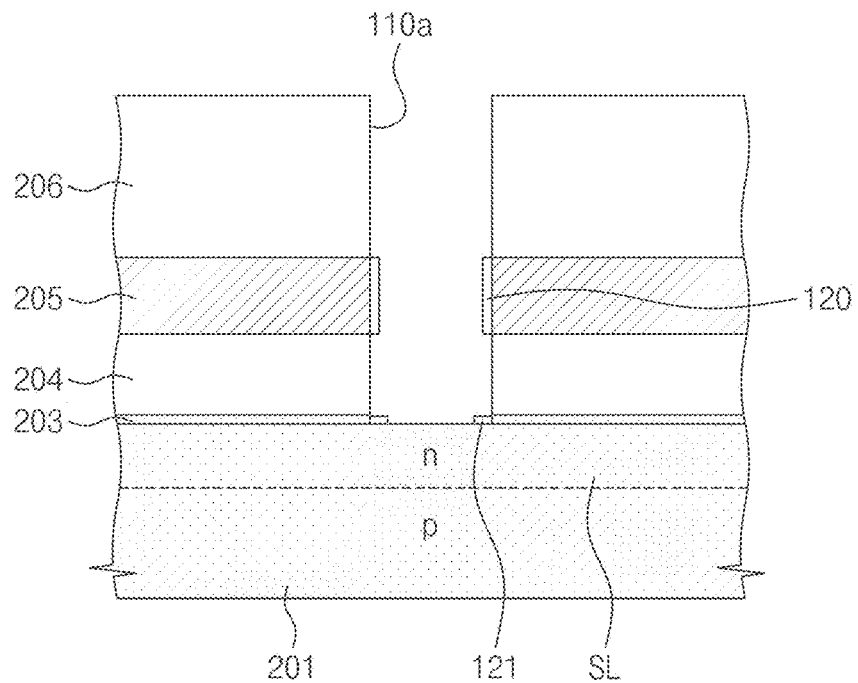

Referring to FIG. 15D, to remove the auxiliary insulating layer 121 formed on the active region when the gate insulating layer 121 is formed, a sacrificial insulating layer may be formed to cove a sidewall of the through-hole 110a. The sacrificial insulating layer may be anisotropically etched to form a sacrificial sidewall 122. An additional etching process may be performed to remove the auxiliary insulating layer 121. Thus, the auxiliary insulating layer 121 may remain only on a bottom surface of the sacrificial sidewall 122. The sacrificial sidewall 122 may be selectively removed.

More specifically, after a sacrificial insulating layer is formed on a substrate where the gate insulating layer 120 is formed, a sacrificial sidewall 122 may be formed on an inner side surface of the through-hole 110a by an anisotropic etching process. The sacrificial sidewall 122 may include silicon nitride. After the sacrificial sidewall 122 is formed, the auxiliary insulating layer 121 may be etched to expose the source line SL. The sacrificial sidewall 122 may be selectively removed by wet etching.

Figure 15F:
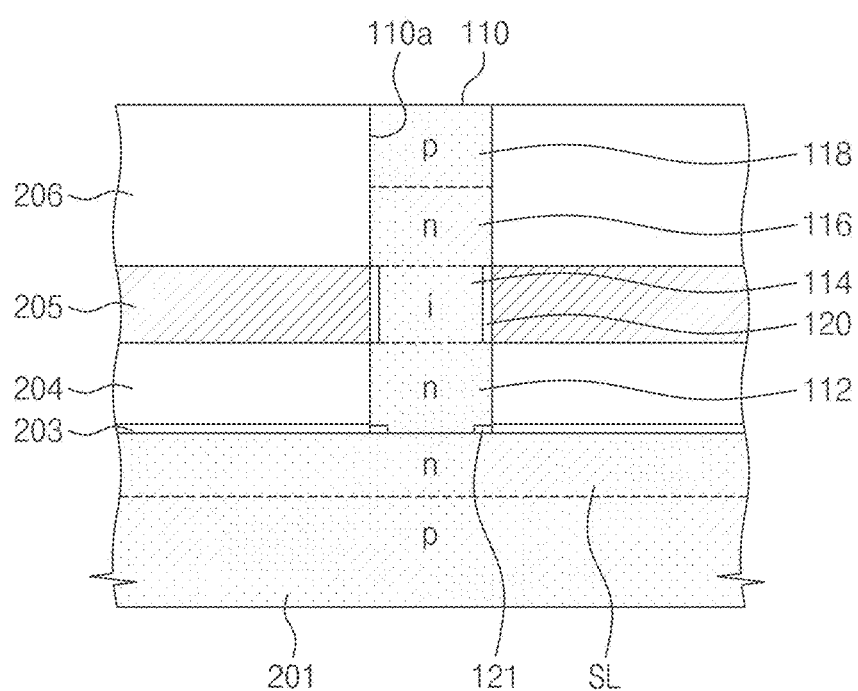

Referring to FIG. 15F, a semiconductor column 110 including a first conductive region 112 of first conductivity type, an intrinsic region 114, a barrier region 116 of the first conductivity type, and a second conductive region 118 of second conductivity type which are sequentially disposed may be formed. The intrinsic region 114 may be aligned with the doped silicon layer 205. The semiconductor column 110 may be formed by a silicon epitaxial process or crystalized by depositing polysilicon and performing an annealing process. The doping may be performed during the silicon epitaxial process or performed by an ion implantation process after the semiconductor column 110 is formed. A planarization process may be performed after the semiconductor column 110 fills the through-hole 110a.

Figure 15G:
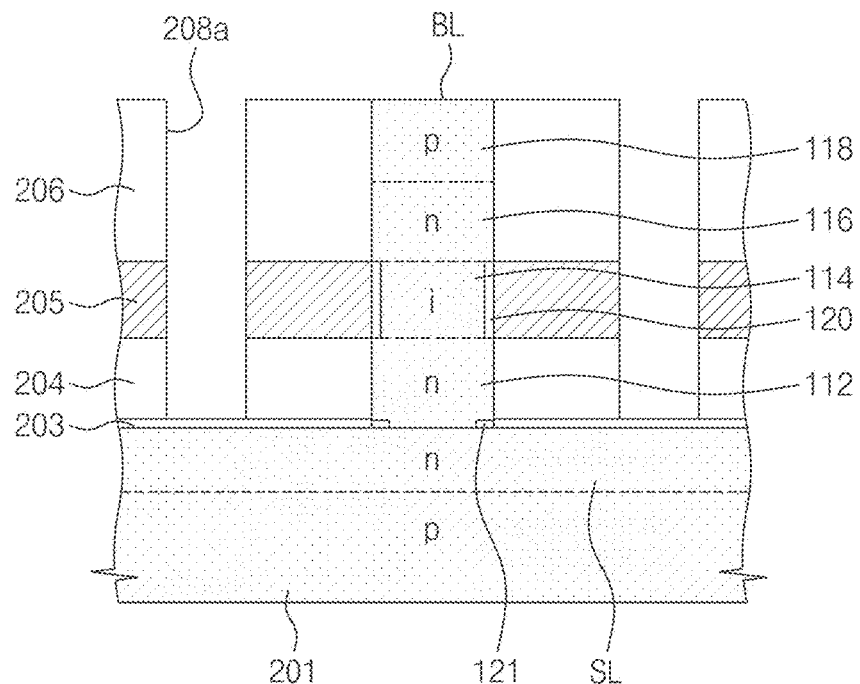

Referring to FIG. 15G, a trench 208a penetrating the second interlayer dielectric 206 and the doped silicon layer 205 and extending in the first direction is formed using a patterning process with the semiconductor columns 110, which are arranged in the first direction, interposed therebetween. Preferably, the trench 208a may penetrate the second interlayer dielectric 206, the doped silicon layer 205, and the first interlayer dielectric 204. Thus, the doped silicon layer 205 extending in the first direction may be isolated to provide a wordline.

Returning to FIG. 13, the trench 208a is filled with a wordline isolation layer 208. The wordline isolation layer 208 may include silicon oxide. After the trench 208a is filled with an insulator, a planarization process may be performed to expose the drain region (the second conductive region 118) of the semiconductor column 110. A bitline is formed to be in contact with the second conductive region 118 of the semiconductor column 110 and to extend in the second direction.

According to modified embodiments, a method for fabricating a semiconductor device includes forming a first line SL extending in a second direction in a substrate 201 having a placement plane defined by a first direction and the second direction perpendicular to the first direction; forming a first interlayer dielectric 204, a doped silicon layer 205, and a second interlayer dielectric 206 on the substrate 201 where the first conductive line SL is formed and forming a through-hole 110a through the second interlayer dielectric 204, the doped silicon layer 205, and the second interlayer dielectric 206; forming a gate insulating layer 120 on an exposed surface of the doped silicon layer 205 within the through-hole 110a; forming a semiconductor column 110 in the through-hole 110a, the semiconductor column 110 including a first conductive region of first conductivity type, a second conductive region of second conductivity, an intrinsic region disposed between the first conductive region and the second conductive region, and a barrier region of the first conductivity type disposed between the intrinsic region and the second conductive region; forming a trench penetrating the second interlayer dielectric and the doped silicon layer with the semiconductor columns, which are arranged in the first direction, interposed therebetween and extending in the first direction; filling the trench with a wordline isolation layer 208; and forming a second conductive line BL to be in contact with the second conductive region and to extend in the second direction. In the case that the first line is a source line SL, the second line may be a bitline BL. In this case, the semiconductor device may be an n-channel semiconductor device, the first conductivity type may be n-type, and the second conductivity type may be p-type.

According to modified embodiments, in the case that the first line is a bitline BL, the second line may be a source line SL. In this case, the semiconductor device may be a p-channel semiconductor device, the first conductivity type may be p-type, and the second conductivity type may be n-type.

Figure 16:
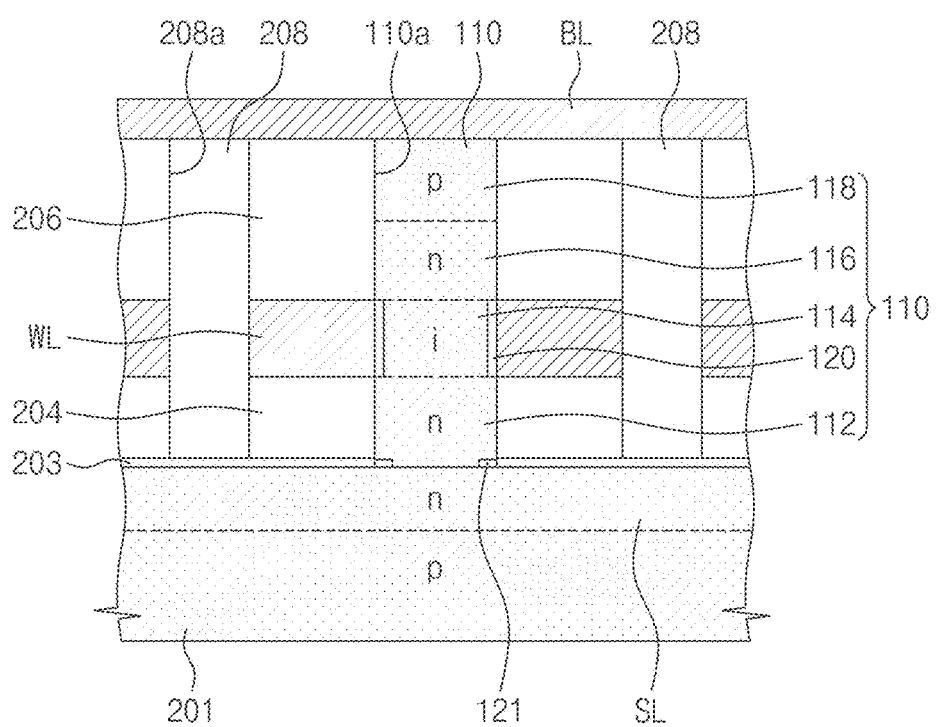
FIG. 16 is a cross-sectional view of a RAM according to another example embodiment of the present disclosure.

FIG. 16 is a cross-sectional view of a RAM according to another example embodiment of the present disclosure. In FIG. 16, sections different from FIG. 15 will be extensively described to avoid duplicate description.

Referring to FIGS. 12 through 16, in FIG. 12, a device isolation layer 202 is removed. A method for fabricating a semiconductor device includes forming a source line SL extending in a second direction on a substrate 201 having a placement plane defined by a first direction and the second direction perpendicular to the first direction; stacking a first interlayer dielectric 204, a doped silicon layer 205, and a second interlayer dielectric 206 on the substrate 201 where the source line SL is formed and forming a through-hole 110a through the second interlayer dielectric 206, the doped silicon layer 205, and the first interlayer dielectric 205; forming a gate insulating layer on an exposed surface of the doped silicon layer 205 within the through-hole 110a; forming a semiconductor column 110 within the through-hole 110a, the semiconductor column 110 including a first conductive region of first conductivity type, an intrinsic region, a barrier region of the first conductivity type, and a second conductive region of second conductivity type; forming a trench 208a with the semiconductor columns, which are arranged in the first direction, interposed therebetween, the trench 208a penetrating the second interlayer dielectric 206 and the doped silicon layer 205 and extending in the first direction; filling the trench 208a with a gate insulating layer 208; and forming a bitline BL, the bitline BL being in contact with the second conductive region of the semiconductor column 110 and extending in the second direction.

To remove an auxiliary insulating layer 121 formed on the active region when the gate insulating layer 120 is formed, a sacrificial insulating layer is formed to cover a sidewall of the through-hole 110a. The sacrificial insulating layer is anisotropically etched to form a sacrificial sidewall and to remove the auxiliary insulating layer 121. Then the sacrificial sidewall is selectively removed.

The source line SL may not be formed at the same time as the device isolation layer 202 is formed by an STI process and may be formed by patterning a separate patterned silicon layer. An auxiliary interlayer dielectric 302 may be disposed between the source line SL and the substrate 201.

Figure 17A:
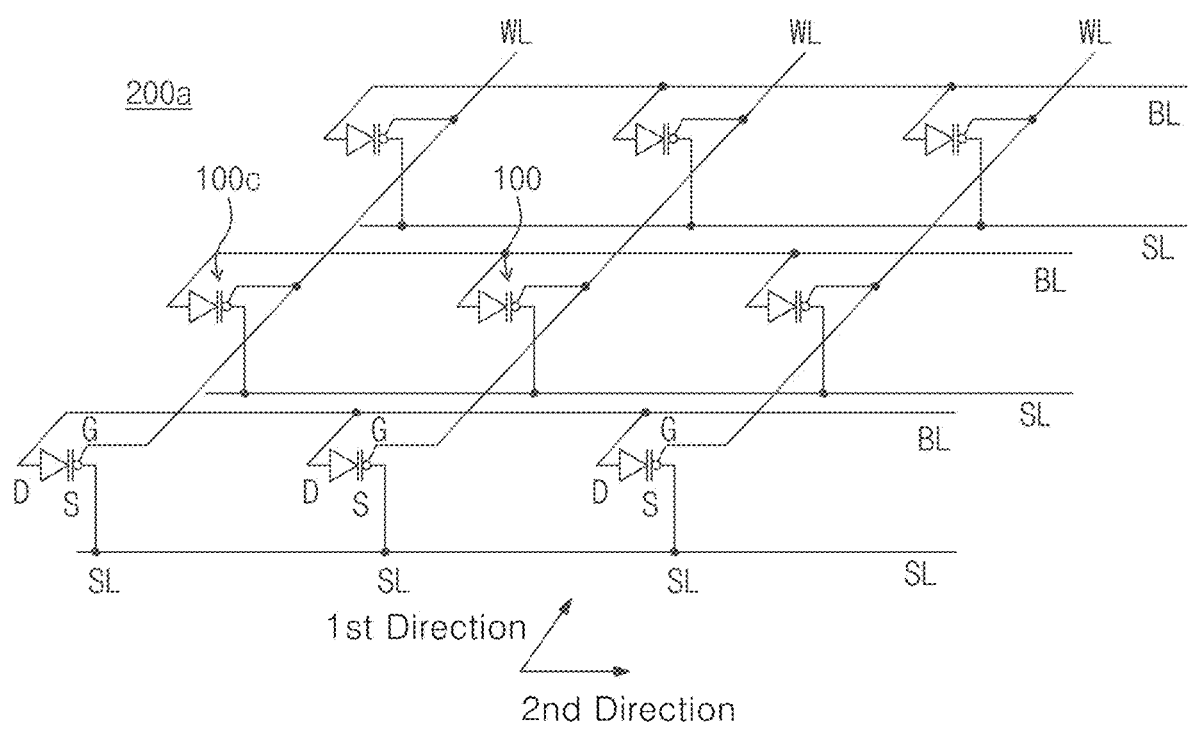
FIG. 17A is a circuit diagram of a capacitorless RAM according to another example embodiment of the present disclosure.

FIG. 17A is a circuit diagram of a capacitorless RAM according to another example embodiment of the present disclosure.

Figure 17B:
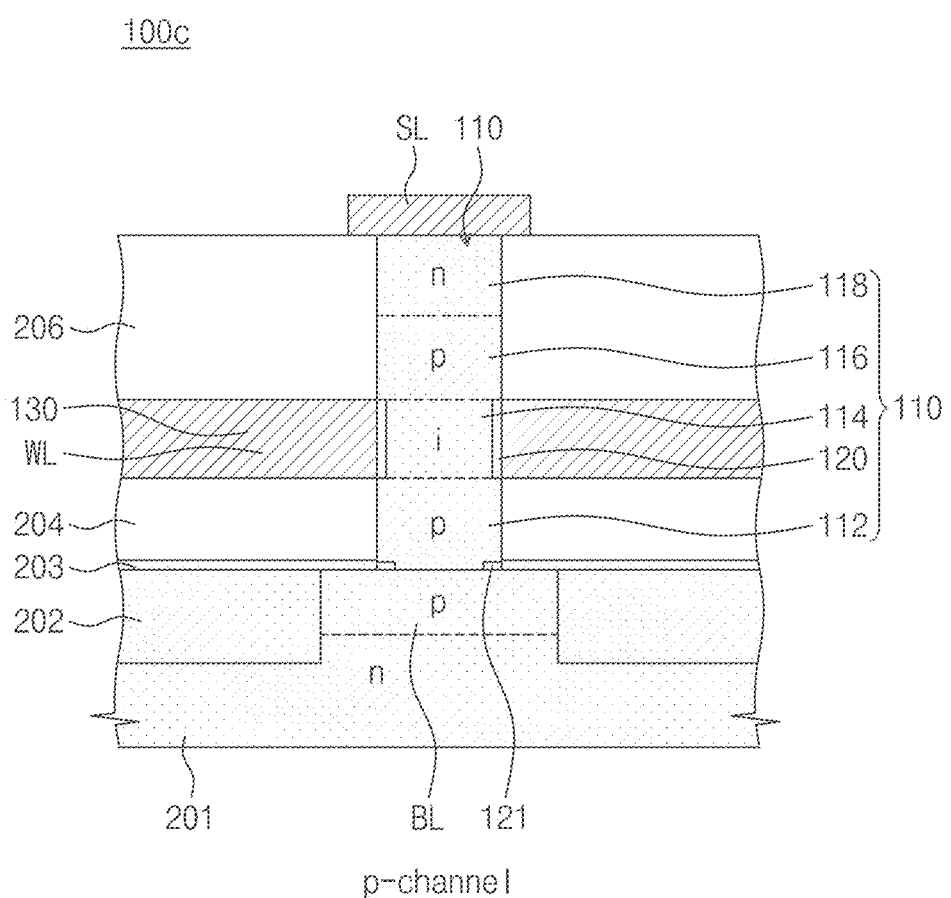
FIG. 17B is a cross-sectional view of a semiconductor device in FIG. 17A.

FIG. 17B is a cross-sectional view of a semiconductor device in FIG. 17A.

Referring to FIGS. 17A and 17B, a capacitorless RAM 200a includes p-channel semiconductor devices 100c arranged in a matrix format. A source line SL may be doped with p-type impurities. A semiconductor column 110 includes a first conductive region 112 of first conductivity type, a second conductive region 118 of second conductivity type, an intrinsic region 114 disposed between the first conductive region 112 and the second conductive region 118, and a barrier region 116 of the first conductivity type disposed between the intrinsic region 114 and the second conductive region 118. The first conductive region 112 is in contact with a bitline BL, and the second conductive region 118 is in contact with the source line SL. The first conductivity type may be p-type, and the second conductivity type may be n-type. In the semiconductor column 110, the first conductive region 112, the intrinsic region 113, the barrier region 116, and the second conductive region 118 may be sequentially stacked.

Figure 18:
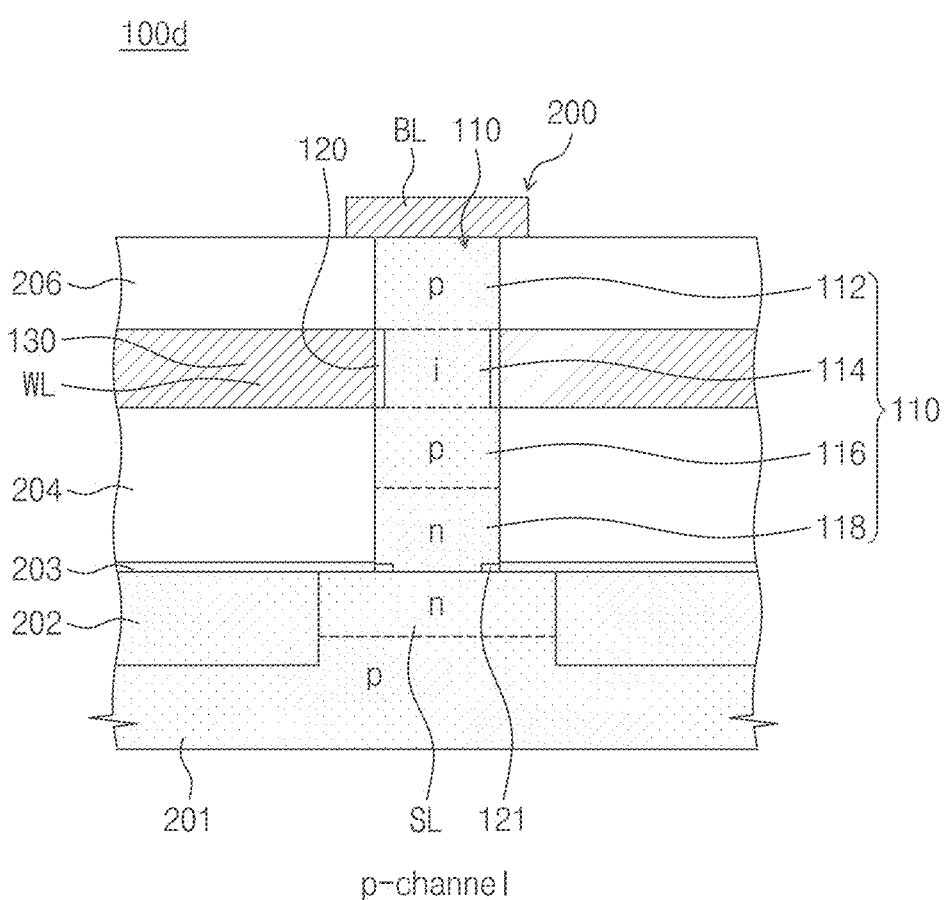
FIGS. 18 and 19 are cross-sectional views of semiconductor devices according to other example embodiments of the present disclosure, respectively.

FIG. 18 is a cross-sectional view of a semiconductor device according to another example embodiment of the present disclosure.

Referring to FIG. 18, a p-channel semiconductor device 100d is shown. A source line SL may include doped silicon, metal or metal-alloy. The semiconductor column 110 include a first conductive region 112 of first conductivity type, a second conductive region 118 of second conductivity, an intrinsic region 114 disposed between the first conductive region 112 and the second conductive region 118, and a barrier region of the first conductivity type disposed between the intrinsic region 114 and the second conductive region 118. The first conductive region 112 may be in contact with a bitline BL, and the second conductive region 118 may be in contact with the source line SL. The first conductivity type may be p-type, and the second conductivity type may be n-type. In the semiconductor column 110, the first conductive region 112, the intrinsic region 113, the barrier region 116, and the second conductive region 118 may be sequentially stacked. The source line SL may be formed on a bottom surface of the semiconductor column 110, and the bitline BL may be formed on a top surface thereof. The source line SL may include silicon doped with n-type impurities.

Figure 19:
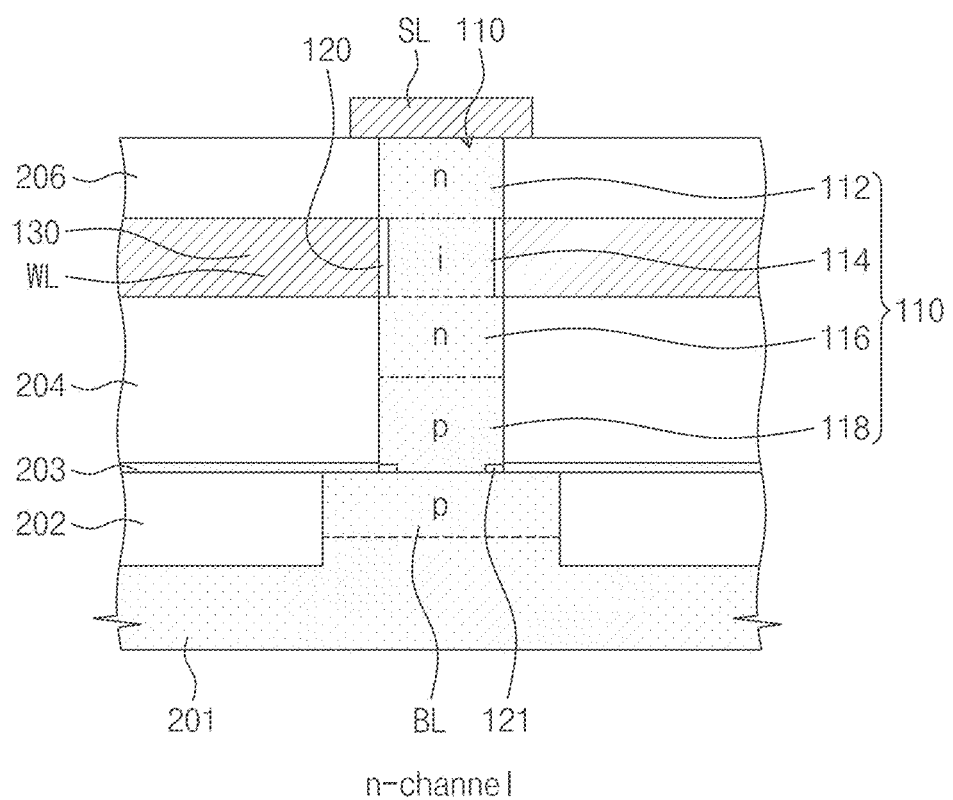

FIG. 19 is a cross-sectional view of a semiconductor device according to another example embodiment of the present disclosure.

Referring to FIG. 19, an n-channel semiconductor device 100b is shown. A source line SL may include doped silicon, metal or metal-alloy. The semiconductor column 110 include a first conductive region 112 of first conductivity type, a second conductive region 118 of second conductivity, an intrinsic region 114 disposed between the first conductive region 112 and the second conductive region 118, and a barrier region of the first conductivity type disposed between the intrinsic region 114 and the second conductive region 118. The first conductive region 112 may be in contact with the source line SL, and the second conductive region 118 may be in contact with the bitline BL. The first conductivity type may be n-type, and the second conductivity type may be p-type. In the semiconductor column 110, the first conductive region 112, the intrinsic region 113, the barrier region 116, and the second conductive region 118 may be sequentially stacked. The bitline BL may be formed on a bottom surface of the semiconductor column 110, and the source line SL may be formed on a top surface thereof. The bitline BL may include silicon doped with p-type impurities.

The n-type semiconductor device 100a or 100b and the p-channel semiconductor device 100c or 100d may be combined on different planes or in a vertically stacked structure to provide an inverter, a logic device such as NOR or NAND circuit or a synapse-mimicking device.

A 1T-SRAM according to example embodiments may provide a volatile memory device including one transistor (1T) based on a p-n-i-n nanostructure beyond a conventional 6T-SRAM structure.

A 1T-SRAM according to example embodiments may provide improved integration and reduced power consumption while using a conventional CMOS process.

A 1T-SRAM according to example embodiments may provide a switching function using characteristics of a read voltage of 0V to operate both a memory and a switch in a single device.

A 1T-SRAM according to example embodiments may improve processing speed with narrow memory operation window and wide current sensing margin characteristics.

According to example embodiments, if a voltage of 0V, a positive voltage, and a negative voltage are respectively applied to a gate during a read operation, a write operation, and an erase operation, a semiconductor memory device may be used as a one transistor-memory device due to the characteristic that the read operation may be performed at the voltage of 0V.

Example embodiment may provide a semiconductor memory device that makes miniaturization and integration of a memory device possible with a simple structure, reduces leakage current to have features of low power and high efficiency, and includes a nanostructure of a new structure to secure sufficient current sensing margin or sufficient read sensing margin even in a narrow memory window and a selective volatile mode operation semiconductor memory device using the semiconductor memory device.

More specifically, example embodiments may provide a semiconductor memory device that requires a low applied voltage during write/erase operations, has a higher on-off current ratio and a low subthreshold swing (SS) characteristic to secure a sufficient current sensing margin even in a narrow memory window, has operating voltage characteristics required per low unit cell structure, and includes a novel nanostructure allowing volatile/switching operation characteristic to be implemented in a single device and a selective volatile mode operation semiconductor memory device using the semiconductor memory device.

Example embodiments will now be described more fully with reference to the accompanying drawings, in which some example embodiments are shown. Example embodiments may, however, be embodied in many different forms and should not be construed as being limited to the embodiments set forth herein; rather, these example embodiments are provided so that this disclosure will be thorough and complete, and will fully convey the scope of example embodiments of the present disclosure to those of ordinary skill in the art. In the drawings, the thicknesses of layers and regions are exaggerated for clarity. Like reference characters and/or numerals in the drawings denote like elements, and thus their description may be omitted.

What is claimed is:

1. A semiconductor device comprising:
   a semiconductor column including a first conductive region of first conductivity type, a second conductive region of second conductivity type, an intrinsic region disposed between the first conductive region and the second conductive region, and a barrier region of the first conductivity type disposed between the intrinsic region and the second conductive region;
   a gate electrode disposed only to cover the intrinsic region with respect to a side view of the semiconductor device; and
   a gate insulating layer disposed between the gate electrode and the intrinsic region,
   wherein the semiconductor device is configured to operate a switchable 1-transistor memory according to a gate voltage applied to a gate and a drain voltage applied to a drain;
   wherein the semiconductor column is forward biased,
   wherein the semiconductor device shows a hysteresis in a drain current with respect to the gate voltage,
   wherein the first conductivity type of the first conductive region is n-type,
   wherein the second conductivity type is p-type,
   wherein the first conductive region provides a source, and the second conductive region provides the drain.

2. The semiconductor device as set forth in claim 1, wherein:
   the semiconductor column extends vertically on a substrate.

3. The semiconductor device as set forth in claim 1, wherein:
   when the semiconductor device operates a nonvolatile memory,
   to write a first logic state, a first gate voltage is applied to the gate electrode and a first drain voltage is applied to the second conductive region,
   to hold the first logic state, a second gate voltage is applied to the gate electrode and a second drain voltage is applied to the second conductive region,
   to read the first logic state, the second gate voltage is applied to the gate electrode and the first drain voltage is applied to the second conductive region,
   to write a second logic state, a third gate voltage is applied to the gate electrode and the first drain voltage is applied to the second conductive region,
   to hold the second logic state, a second gate voltage is applied to the gate electrode and the second drain voltage is applied to the second conductive region, and
   to read the second logic state, the second gate voltage is applied to the gate electrode and the first drain voltage is applied to the first conductive region.

4. The semiconductor device as set forth in claim 3, wherein:
   the first gate voltage is between −0.25V and −1V,
   the second gate voltage is between −0.1V and 0.1V,
   the third gate voltage is between 0.25V and 1V,
   the first drain voltage is between 0.5V and 1.5V, and
   the second drain voltage is 0V.

5. The semiconductor device as set forth in claim 1, wherein:
   when the semiconductor device operates as a switch,
   to switch to a first state, a positive first gate pulse is applied to the gate electrode while a first drain voltage is applied to the second conductive region, and
   to switch to a second state from the first state, a negative second gate pulse is applied to the gate electrode while the first drain voltage is applied to the second conductive region,
   the first state is maintained after the positive first gate pulse is removed,
   the second state is maintained after the negative second gate pulse is removed.

6. The semiconductor device as set forth in claim 3, wherein:
   the first gate voltage is a negative voltage,
   the second gate voltage is a positive voltage, and
   the drain voltage is between 0.5V and 1.5V.

7. The semiconductor device as set forth in claim 2, wherein:
   the substrate includes an active region and a device isolation layer,
   the first conductive region is disposed in contact with the active region, and
   the active region is doped with impurities of the first conductive type.

8. The semiconductor device as set forth in claim 2, further comprising:
   a source line disposed on the substrate, wherein:
the first conductive region is disposed in contact with the source line, and
the source line includes silicon doped with impurities of the first conductivity type.

9. The semiconductor device as set forth in claim 2, wherein:
the first conductive region, the intrinsic region, the barrier region, and the second conductive region are sequentially disposed along the semiconductor column as proceeding from a bottom surface to a top surface.

10. The semiconductor device as set forth in claim 2, wherein:
the second conductive region, the barrier region, the intrinsic region, and the first conductive region are sequentially disposed along the semiconductor column as processing from a bottom surface to a top surface.

11. The semiconductor device as set forth in claim 2, further comprising:
a ring-shaped residual oxide layer disposed to cover the semiconductor column on a bottom surface of the semiconductor column.

12. A semiconductor device comprising:
a semiconductor column including a first conductive region of first conductivity type, a second conductive region of second conductivity type, an intrinsic region disposed between the first conductive region and the second conductive region, and a barrier region of the first conductivity type disposed between the intrinsic region and the second conductive region;
a gate electrode disposed only to cover the intrinsic region with respect to a side view of the semiconductor device; and
a gate insulating layer disposed between the gate electrode and the intrinsic region,
wherein the semiconductor device is configured to operate a switchable 1-transistor memory according to a gate voltage applied to a gate and a drain voltage applied to a drain,
wherein the semiconductor column is forward biased,
wherein the semiconductor device shows a hysteresis in a drain current with respect to the gate voltage,
wherein the semiconductor column extends vertically on a substrate,
wherein the first conductivity type of the first conductive region is p-type,
wherein the second conductivity type is n-type, and
the first conductive region provides a drain, and the second conductive region provides a source.

* * * * *